United States Patent [19]
Uhling et al.

[11] Patent Number: 5,629,617
[45] Date of Patent: May 13, 1997

[54] MULTIPLEXING ELECTRONIC TEST PROBE

[75] Inventors: Thomas F. Uhling, Monument; David J. Dascher, Colorado Springs; Kenneth Rush, Colorado Springs; Keith C. Griggs, Colorado Springs, all of Colo.

[73] Assignee: Hewlett-Packard Company, Palo Alto, Calif.

[21] Appl. No.: 369,607

[22] Filed: Jan. 6, 1995

[51] Int. Cl.$^6$ .................................................. G01R 1/04
[52] U.S. Cl. .................................. 324/158.1; 324/763
[58] Field of Search ................................ 324/763, 158.1, 324/72.5

[56] References Cited

U.S. PATENT DOCUMENTS

| | | | |
|---|---|---|---|
| 5,103,557 | 4/1992 | Leedy | 29/832 |
| 5,418,470 | 5/1995 | Dagostino et al. | 324/763 |

OTHER PUBLICATIONS

Hewlett Packard; Oscilloscope Probes and Accessories; Technical Data; cover page, p. 17, and Index.

*Primary Examiner*—Kenneth A. Wieder
*Assistant Examiner*—Barry C. Bowser

[57] ABSTRACT

An analog electronic test probe includes hundreds of inputs each connected to two amplifiers, each in a separate multiplexer stage on an integrated circuit. A programmer, responsive to a dial, shifts data through a shift register of latches each of which is connected to one of the amplifiers, activating the amplifier(s) connected to the selected input, thereby multiplexing it (them) to selected output(s). Similarly, the gain for each output may be selected. An outdisable circuit connected to the outputs of each multiplexer and the outputs of each IC chip causes each output to appear electrically as an open circuit when no input associated with the multiplexer or chip is selected. This permits any number of multiplexers and IC chips to be daisy-chained together.

17 Claims, 16 Drawing Sheets

MULTIPLEXING ELECTRONIC TEST PROBE

BACKGROUND OF THE INVENTION

1. Field of the Invention

The invention in general relates to electronic test probes for passing a test signal from a electronic circuit element to be tested to an oscilloscope or other electronic measurement device, and more particularly to such a probe that passes the test signal with high signal integrity over a high band width.

2. Statement of the Problem

Electronic test probes are commonly used to pass analog test signals from a circuit under test to an oscilloscope or other electrical or electronic test instrument. Such an electronic probe must be capable of passing an electrical signal on a node or pin of the circuit under test tests to the test instrument without distoting it, i.e. with high signal integrity. Further, it should not apply any voltage or current to the circuit under test.

Early probes consisted of carefully designed passive circuits with high impedance inputs and with an output impedance comparable to the input impedance of the test instrument. Such passive probes simply passed a signal from the circuit under test to the test instrument.

Present-day electronic circuits operate over frequencies from DC to several gigahertz. Thus, test probes capable of being used with a wide variety of circuits must be able to provide high signal integrity over a wide band width of frequencies. Thus, state-of-the-art test probes are active probes, that is, probes with active circuit elements, such as transistors, driven by a probe power source. Such probes, though small enough to be easily manipulated by hand, are highly sophisticated instruments that may cost several thousand dollars.

The art of test probes that pass analog signals to a test instrument should be distinguished from the digital test equipment art. In the latter art high signal integrity is not a significant goal, since digital test instruments only need to detect the rise or fall of a digital signal.

Integrated and hybrid circuits are becoming both more complex and smaller, leading to ever higher numbers of package leads crowded into less and less space, that is, the leads are becoming extremely dense with very tight pitches. The art has responded to this requirement by producing large numbers of gadgets designed to interlace with circuit packages, such as plastic quad flat packs (PQFP). These gadgets provide an interconnect between the dense array of output pins on a circuit package to a less dense array of outputs that can be more easily contacted manually with a hand held probe.

Another solution is a probe multiplexing unit, such as the HP 54300A probe multiplexer made by Hewlett Packard Company. A number of probes can be connected to the back of this multiplexing unit, and the probe to be connected to the output can be selected by a mechanical switch. This unit is capable of multiplexing eight probes and permits switching back and forth between a few circuit points without manually resetting a probe. The system still requires mechanical setup of each probe, and is relatively expensive, since it requires a multiplicity of probes. Moreover, the unit is a thirty pound box requiring about two square feet of volume and does not lend itself to rapidly probing a large number of microcircuits.

All of the above state-of-the-art electronic probe systems have many drawbacks. It is time consuming to measure signals one at a time by hand. Further, the interconnect methods leave uncertainties in the ground and signal path lengths that can significantly affect the signals under test. Moreover, even if the path lengths are known, the existence of a long signal path from package, through connector, through probe input cable, through probe, through probe output cable, to test instrument can itself result in measurement inaccuracies. Thus the state-of-the-art electronic test probe system is subject to coupling errors, overshoot errors, risetime errors, timing errors in general and other inaccuracies.

3. Solution to the problem

The present invention solves the above problems by providing an electronic test probe having a multiplexer in the probe head. The multiplexer is programmable, allowing the user to selectably connect any one of a large number of probe inputs to any one of a number of probe outputs. In the preferred embodiment, any two of several hundred inputs can be connected to two outputs. The multiplexer is implemented on an integrated circuit (IC) chip.

The combination of a programmable multiplexer implemented on an integrated circuit chip permits hundreds of inputs to be alternatively connected to the probe output, with no manual manipulation of the probe itself, and the elimination of all the potentialities for error that go along with such manipulation. For each connection on the integrated circuit, the signal and ground paths are both well-defined and short. This eliminates all the inaccuracies due to signal path uncertainties and length.

The integrated circuit chip is designed so that any number of chips can be daisy-chained together in the probe head so that different probe heads accommodating different packages on the market can be economically designed and manufactured. Herein, "daisy-chained" means that the outputs of individual components, such as multiplexers or chips, can be connected to a single line, at any point in the line, which line then forms the common output for all such components. To design and build a separate integrated circuit for each package on the market would be exorbitantly expensive. With the chip of the invention, just a few chips can accommodate a large percentage of the available circuit packages.

The invention also includes a programmable, selectable gain amplifier within the chip. Thus both the input and the gain for each input are selectable, while still maintaining the advantages described above.

The invention further includes on-chip input dividers, so that the signals can be attenuated without losing any of the above advantages. There are also on-chip spark gaps and diode clamping so that ESD events do not interfere with the high band width, high signal integrity in the probe output. The on-chip circuit fully compensates for the ESD devices so the ESD devices themselves also do not interfere with the high band width, high signal integrity in the probe output.

SUMMARY OF THE INVENTION

The invention provides an analog electronic test probe of the type including a probe head adapted to be held in one hand, the probe head manually connectable to a circuit to be tested and including a plurality of probe inputs and a probe output; the test probe comprising selection means for selecting one of the probe inputs; and the probe head further comprising multiplexing means, responsive to the selection means, for electrically connecting the selected probe input to the probe output. Preferably, the multiplexing means comprises an integrated circuit and the selection means includes a computer. Preferably, the multiplexing means comprises: a plurality of amplifiers, each of the amplifiers connected to one of the inputs; and means for activating the amplifier associated with the selected input. Preferably, the selection means further comprises gain selection means for selecting one of a plurality of possible gains for signals passing from the selected input to the output, and the integrated circuit comprises multiple gain means, responsive to the gain selection means, for providing the selected gain to the signals. Preferably, the test probe further includes an on-chip spark gap, on-chip diode clamping, and an on-chip input divider network, and all of the electronic components in the input circuit the chip can withstand ESD voltages up to the break-down voltage of the spark gap. Preferably, the probe includes a plurality of outputs, the selecting means comprises means for selecting which of the inputs is to be connected to which of the outputs, and the multiplexing means comprises means for electrically connecting each selected input to the corresponding selected output or outputs.

In another aspect the invention provides an analog electronic test probe comprising: a plurality of probe inputs divided into a plurality of probe input groups; an output; selection means for selecting one of the plurality of probe inputs; a plurality of multiplexers, each corresponding to one of the probe input groups; each of the multiplexers including a plurality of multiplexer inputs, each connected to a probe input in its corresponding probe input group; each of the multiplexers including a multiplexer output; each multiplexer responsive to the selection means for electrically connecting the selected probe input to its output when the selected probe input is in the group of probe inputs corresponding to the mutliplexer; and the multiplexer outputs being daisy-chained together and connectable to the probe output. Preferably, each of the multiplexer integrated circuits includes outdisable means for placing its multiplexer output in a state in which it appears electrically as an open circuit when none of the inputs in its corresponding group of probe inputs is selected.

In a further aspect the invention provides an analog electronic test probe comprising: a plurality of probe inputs divided into a plurality of probe input groups; an output; selection means for selecting one of the plurality of probe inputs; a plurality of integrated circuits, each corresponding to one of the probe input groups; each of the integrated circuits including a plurality of integrated circuit inputs, each connected to a probe input in its corresponding probe input group; each of the integrated circuits including an integrated circuit output; each integrated circuit responsive to the selection means for electrically connecting the selected probe input to its output when the selected probe input is in the group of probe inputs corresponding to the integrated circuit; and the integrated circuit outputs being daisy-chained together and connectable to the probe output. Preferably, each of the integrated circuits includes outdisable means for placing its integrated circuit output in a state in which it appears electrically as an open circuit when none of the inputs in its corresponding group of probe inputs is selected.

In still another aspect the invention provides an analog electronic test probe comprising: an input and an output; and outdisable means connected to the output for causing the output to appear electrically as an open circuit. Preferably, the input is one of a plurality of inputs, the test probe further comprises a multiplexer connected to the inputs and having a multiplexer output, and the output comprises the multiplexer output, or, alternatively, the input is one of a plurality of inputs, the test probe further comprises an integrated circuit connected to the inputs and having an integrated circuit output, and the output comprises the integrated circuit output. Preferably, the probe further includes activation means for activating and deactivating the outdisable disable means so that the output appears electrically as an open circuit only when the activating means activates the outdisable means.

In yet a further aspect the invention provides an analog electronic test probe of the type including a probe head adapted to be held in one hand, the probe head manually connectable to a circuit to be tested and including a probe input and a probe output; the test probe comprising: a plurality of gain circuits, each gain circuit having a different gain; input means for selecting one of a plurality of possible gains for signals passing from the input to the output; a computer responsive to the input means for producing signals representative of the selected gain; and gain circuit activation means responsive to the signals for electrically connecting one of the gain circuits between the input and output to provide the selected gain.

In another aspect the invention provides an analog electronic test probe of the type including a probe head adapted to be held in one hand, the probe head manually connectable to a circuit to be tested and including: a plurality of probe inputs; a probe output; and memory means in the probe head for storing calibration information related to each of the probe inputs. Preferably, the probe includes a plurality of outputs; each combination of one of the probe inputs with one of the probe outputs defines a probe channel; and the memory means comprises means for storing calibration information related to each of the probe channels.

The invention not only provides a hand held electronic test probe that can multiplex hundreds of inputs to a few outputs which maintaining high band width and high signal integrity, it also does this in a manner that allows a probe head that interfaces with almost any common circuit package to be manufactured relatively inexpensively. Further, for the first time it provides an interface between hand held analog probes and a computer, opening the door to the speed and economies associated with computerization. That is, once the probe head is manually connected to the circuit under test, the testing of any node in the circuit is a hands free operation. Numerous other features, objects and advantages of the invention will become apparent from the following description when read in conjunction with the accompanying drawings.

DESCRIPTION OF THE PREFERRED EMBODIMENT

1. Overview

Figure 1:
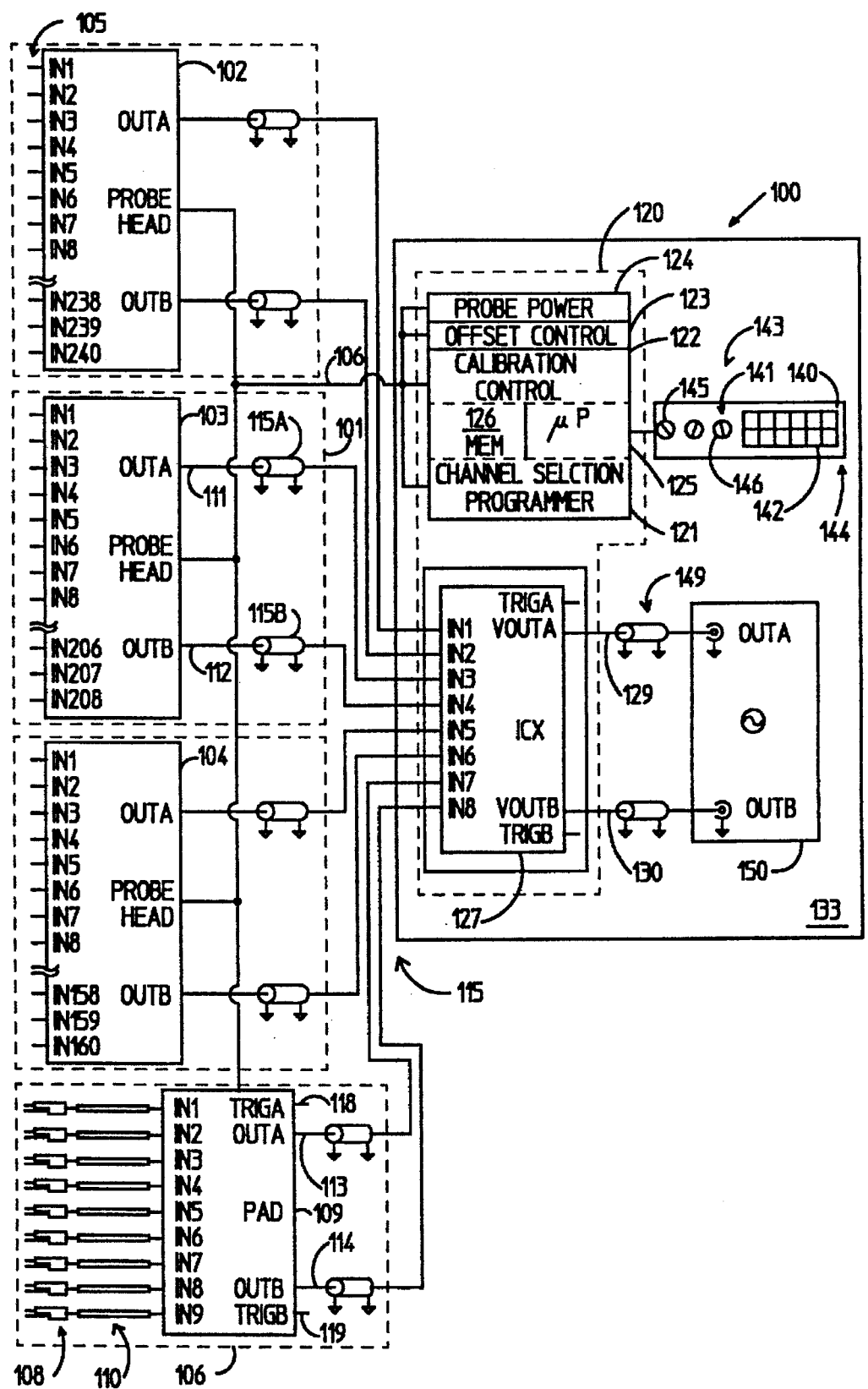
FIG. 1 is a block circuit diagram of the preferred embodiment of an electronic probe system according to the invention.

FIG. 1 shows the preferred embodiment of an analog electronic test probe system 100 according to the invention. It should be understood that the specific system shown in the figures and described herein, is exemplary. That is, it is intended to show preferred examples of the invention so that those skilled in the art can fully understand and implement it. It is not intended to limit the invention to the specific examples described and shown herein.

In this disclosure, the term "electrically connected" when applied to two electrical elements, such as an input and an output, means that an electrical signal, such as a voltage, a current, an analog signal, or a digital signal, will pass from one element to the other. This is in distinction to a physical connection by electrical components. For example, an input and an output may be physically connected by wires, amplifiers, transistors, resistors and other electrical components, but no signal will pass from the input to the output because one or more of the switching or amplification components may be off. In this case, the input and output are not "electrically connected". In this disclosure "amplifier" means an electronic circuit that passes signals, usually changing the amplitude, without significant distortion, and includes 1:1 amplifiers as well as negative amplifiers, not just amplifiers with a positive gain.

Figure 14:
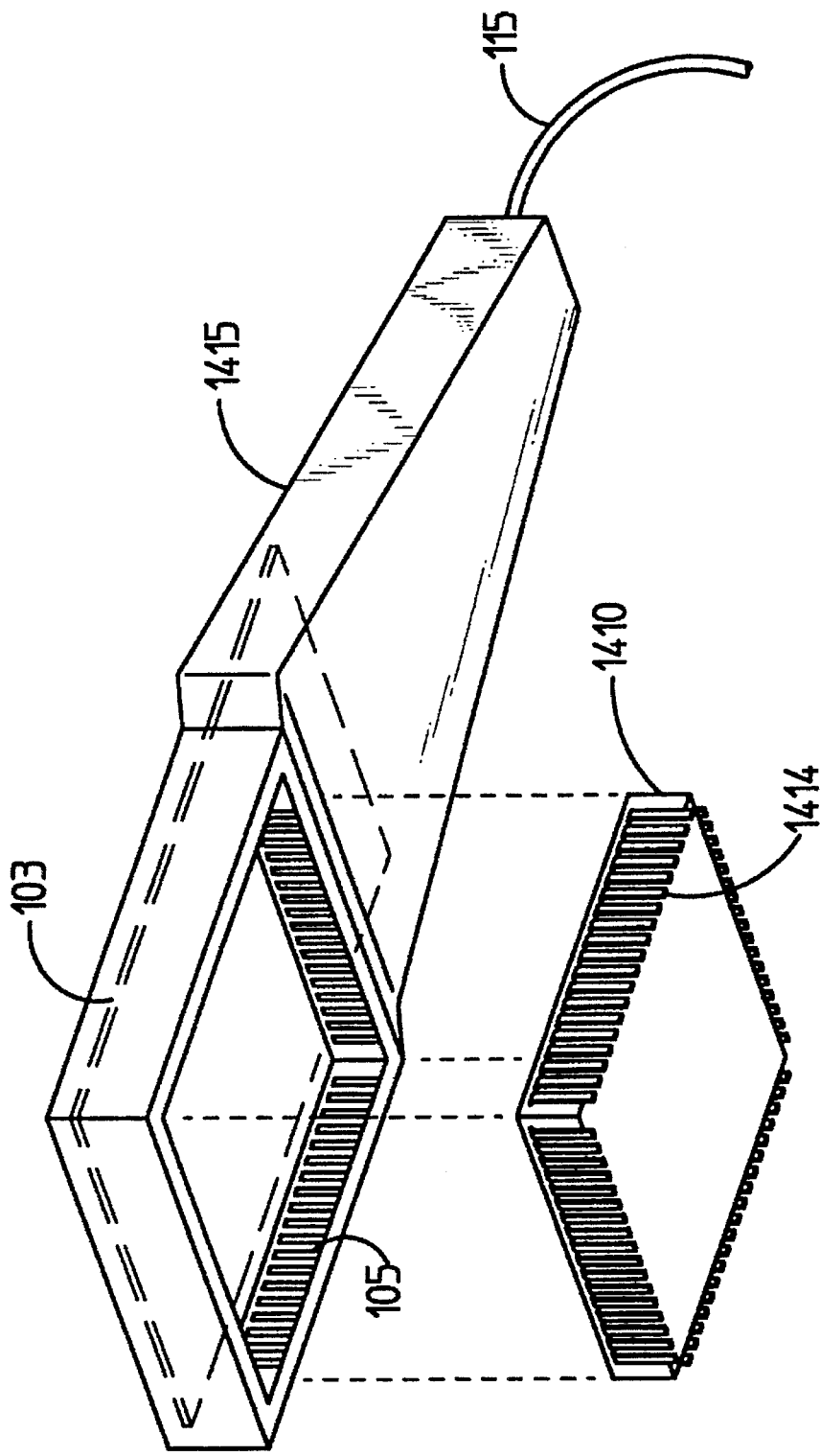
FIG. 14 shows a probe head and the manner of manually connecting it to a PQFP.

Probe system 100 includes three PQFP probes, such as 101, each of which include a probe head, such as 103, and two of coaxial cables 115. Each of probe heads 102, 103 and 104 has a specific number of inputs 105 and is mechanically enclosed in a probe body, such as 1415 (FIG. 14), which probe body is designed to be easily held in one hand and easily mechanically coupled to a specific plastic quad flat pack (PQFP) 1410 (FIG. 14). The probe inputs 105 are designed to be easily electrically coupled to the inputs of the specified PQFP. For example, probe head 102 is designed to couple to a PQFP with 240 pins, probe head 103 is designed to couple to PQFP with 208 pins 1414, while probe head 104 is designed to couple to a PQFP having 160 pins. Except for the fact that invention is contained in a probe body 1415 that can be held in one hand and manually connected to a circuit package, the mechanical design of the probe heads, such as 102, and how inputs 105 connect to the pins of a PQFP is not a part of the present invention, and thus will not be discussed further herein.

The exemplary probe system 100 also includes a general purpose single point probe 106, which includes nine probe tips 108 and a circuit pad 109. Each probe tip 108 is connected to pad 109 via a 100 ohm coaxial cable 110. General purpose probe 106 may be used to probe circuits for which no specific probe head is available.

As will be seen in detail below, it is a feature of the invention that once the probe heads, such as 103, and probe tips 108 are connected to the circuit under test, the remainder of the testing is essentially hands free; that is, any node connected to the probe heads may be tested without manually resetting the probe heads.

The probe system 100 has two outputs 129 and 130. Likewise most of the system components, such as probe heads 102–104 and pad 109 have two outputs, such as 111 and 112 for probe head 103 and 113 and 114 for pad 109. In each case we shall refer to one output as the "A" output and the other as the "B" output. Each probe head 102, 103, 104 can connect any of its inputs 105 to either or both of its outputs. For example, probe head 103 can connect any of its 240 inputs to either or both of its outputs, 111 and 112. Pad 109 can also connect any one of its probe tips 108 to either or both of its outputs 113 and 114. This function involves the heart of the invention, and will be discussed in detail below. Each of the separate paths through the system that a signal can follow from a selected one of the inputs 105 or probe tips 108 to a selected one of the probe outputs 129 and 130, defines a channel. In the case of the probe 100 and its components in general, half the channels pass through the "A" output 129 and half through the "B" output 130. As a shortened notation, in some instances below we shall refer to electronic circuits or elements on the "A" output side of the system, or to a component as an "A" or "B" channel component. All inputs can be connected to either the "A" output 129 or the "B" output. Thus each input has an "A" channel associated with it and a "B" channel associated with it. As will be seen below, there are three different channels through multiple gain output stages 506 and 508 (FIG. 5) in the second level multiplexer 127. When these different gain channels are included, each input has three "A" channels associated with it and three "B" channels associated with it.

Probe system 100 also includes a printed circuit board (PCB) 120 which fits into a logic analyzer 133 designed to interface with the probe, which logic analyzer is sometimes referred to in the art as a "main frame". PCB 120 contains a channel selection programmer circuit 121, a calibration control circuit 122, an offset control circuit 123, and a probe power circuit 124, which circuits share a microprocessor 125 and its associated memory 126; e.g. the channel selection programmer 121 includes memory 126 and microprocessor 125 in that channel selection software stored in memory 126 is used by microprocessor 125 to provide output signals that cause the programmer 121 to output data on line 160 to program the latches in the probe 100, which latches will be discussed below. Microprocessor 125 and memory 126 are not on PCB 120 but are in main frame 133, and thus are shown with a dotted line around them. Channel selection programmer 121 preferably includes a field programmable gate array which is programmed to interact with microprocessor 125 and memory 126 to output a series of bits to shift registers 690, 1190 comprising latches shown in FIGS. 6, 7, 11 and 12, which will be discussed in detail below. The various circuits 121 through 126 on PCB 120 include other electrical elements and interconnections that, to those skilled in the art, will be clear from the following description.

PCB 120 also includes a second level multiplexer 127. Multiplexer 127 is implemented as an integrated circuit (IC) die on PCB 120, and is capable of connecting any of its 8 inputs to either or both of its outputs, 129 and 130. In addition, probe system 100 includes means 140 for inputting control signals, such as for programming second level multiplexer 127, probe heads 102–104, and pad 109. In the preferred embodiment, means 140 includes dials 141 and a keyboard 142, though almost any mechanism for generating electrical control signals may be used. In the preferred embodiment, the dials 141 are located on the front of the logic analyzer 133, and the keyboard is a computer work station keyboard; however, for simplicity they are shown on a common control signal input means 140. In the preferred embodiment several dials 145 together with channel selection programmer 121 comprise selection means 143 for selecting one of the probe inputs 105, 108 and one of the probe outputs 129 or 130, while one dial 146 together with channel selection programmer 121 comprise gain selection means 144 for selecting one of a plurality of possible gains for signals passing from said selected input to said output.

The outputs 111, 112, of probe heads 102–104 and pad 109 are connected to second level multiplexer 127 via standard 50 ohm coaxial cables 115. The outputs 129, 130 of second level multiplexer 127 are connectable to a test instrument, such as an oscilloscope 150, via 50 ohm microstrip "coax's" 149. Control PCB 120 is connected to probe heads 102–104, pad 109 and second level multiplexer 127 via a multiwire cable 160. Multiwire cable 160 includes conventional power lines, a serial interface including data and clock lines, and other lines. In the preferred embodiment, coaxial cables 115 and wires 160 are bound together in a single cable.

Pad 109 and second level multiplexer 127 are also capable of multiplexing its inputs to two trigger outputs, such as 118 and 119, though, in the embodiment shown, these are not used.

An analog electronic probe according to the invention may take many other forms than that shown in FIG. 1. The specific embodiment shown has been chosen for its usefulness in illustrating in one system several of the possibilities for implementing the invention, i.e probes 101 and 106, second level multiplexer 127, as well as the probe system 100 as a whole.

2. Detailed Description of the Preferred Probe Circuit

Figure 2:
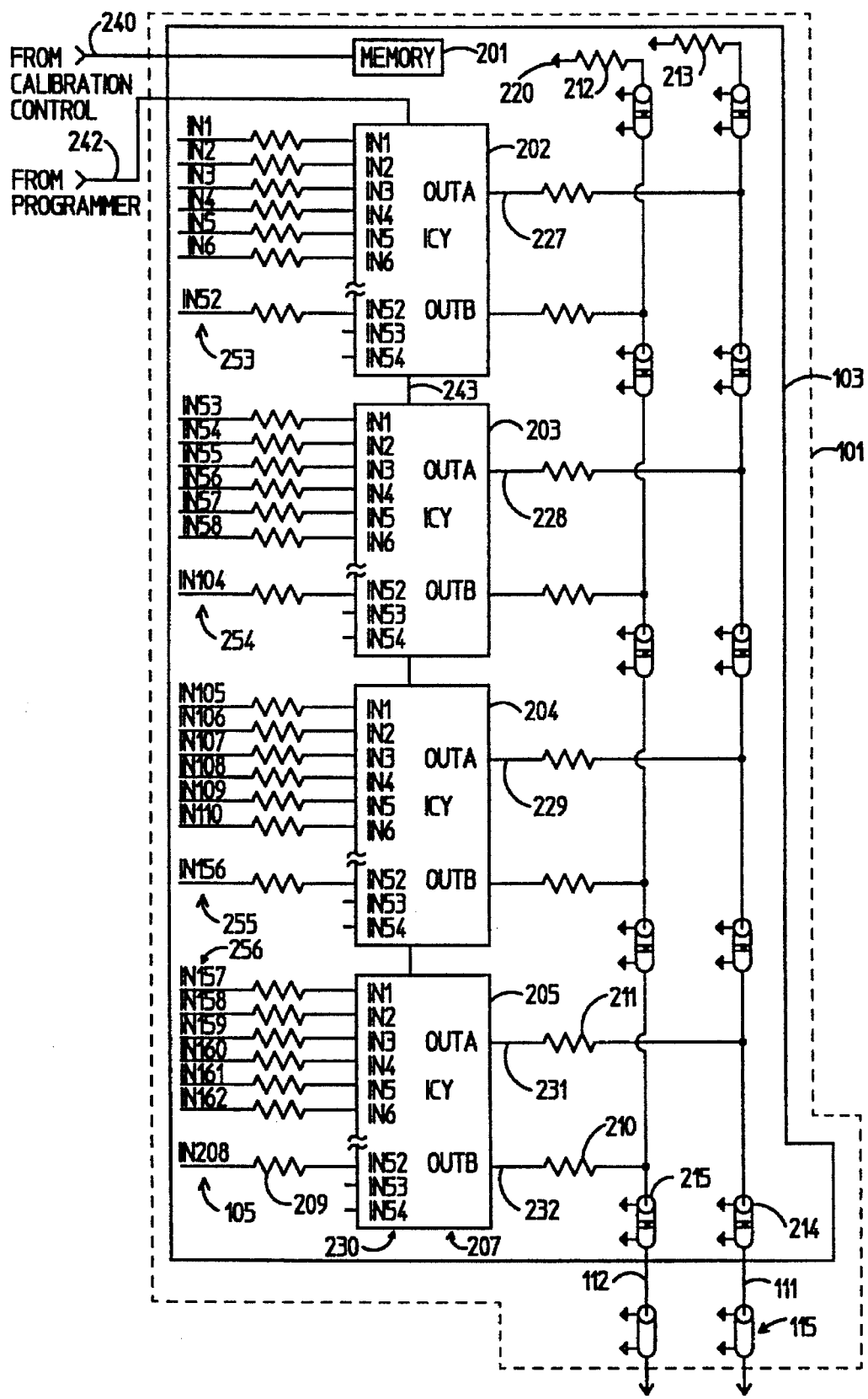
FIG. 2 is block circuit diagram of a typical high density PQFP probe head of the probe system of FIG. 1.

Turning to FIG. 2, a semi-block circuit diagram of two-hundred-and-eight pin PQFP probe 101 is shown. Probe 101 includes probe head 103 and coaxial cables 115. Probe head 103 includes memory 201, multiplexing means 207 comprising four custom integrated circuit chips 202–205, two-hundred-and-eight probe inputs 105, two-hundred-and-eight input resistors, such as 209, eight output resistors, such as 210, 50 ohm microstrip "coax" 214 and 215, and microstrip terminating resistors 212 and 213. Inputs 105 are divided into four groups, 253, 254, 255, and 256, each associated with one of IC's 202–205.

Figure 11:
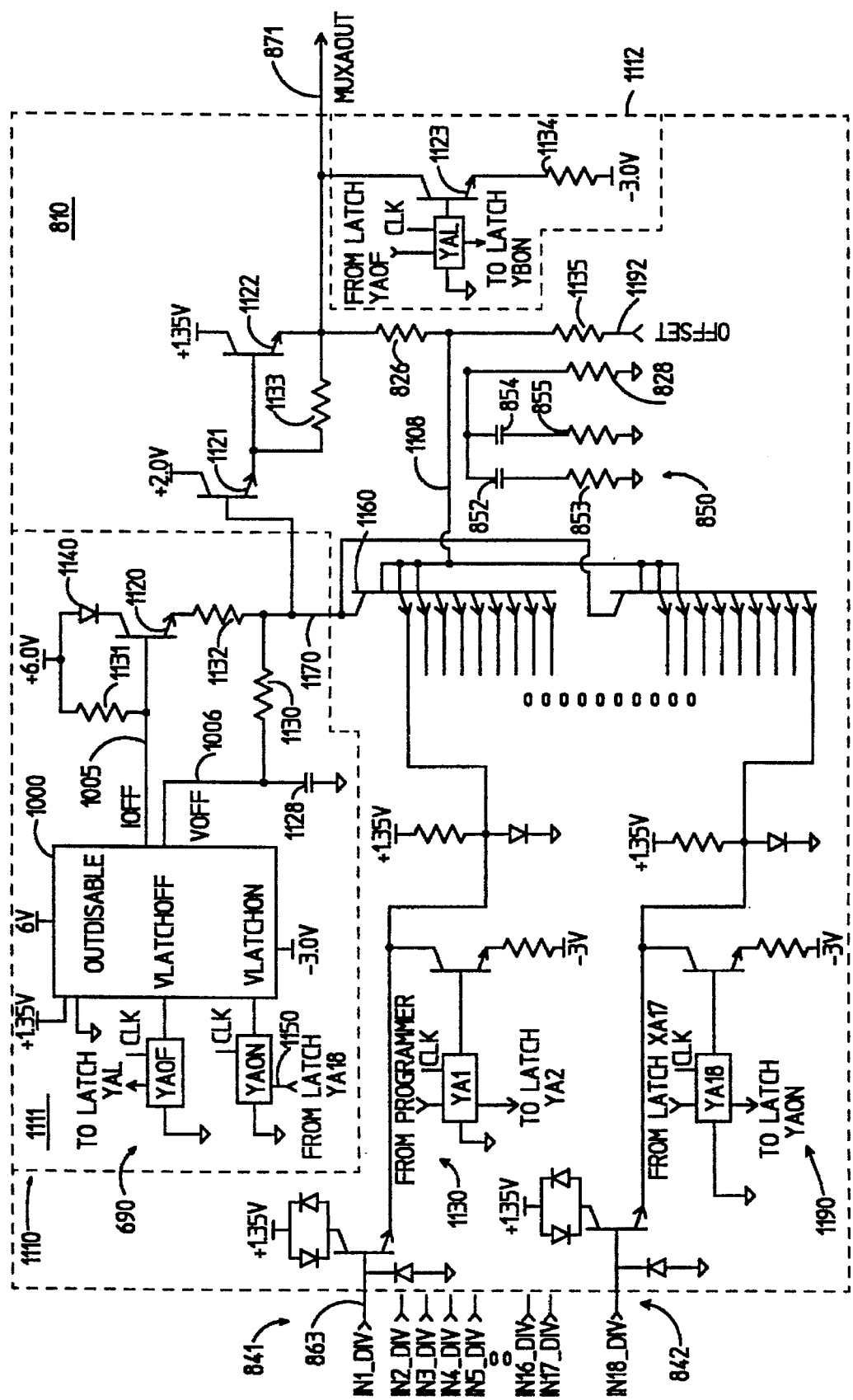
FIG. 11 is a circuit diagram of the multiplexer amplifier in the "Y" integrated circuit chip of FIG. 8.
Figure 12:
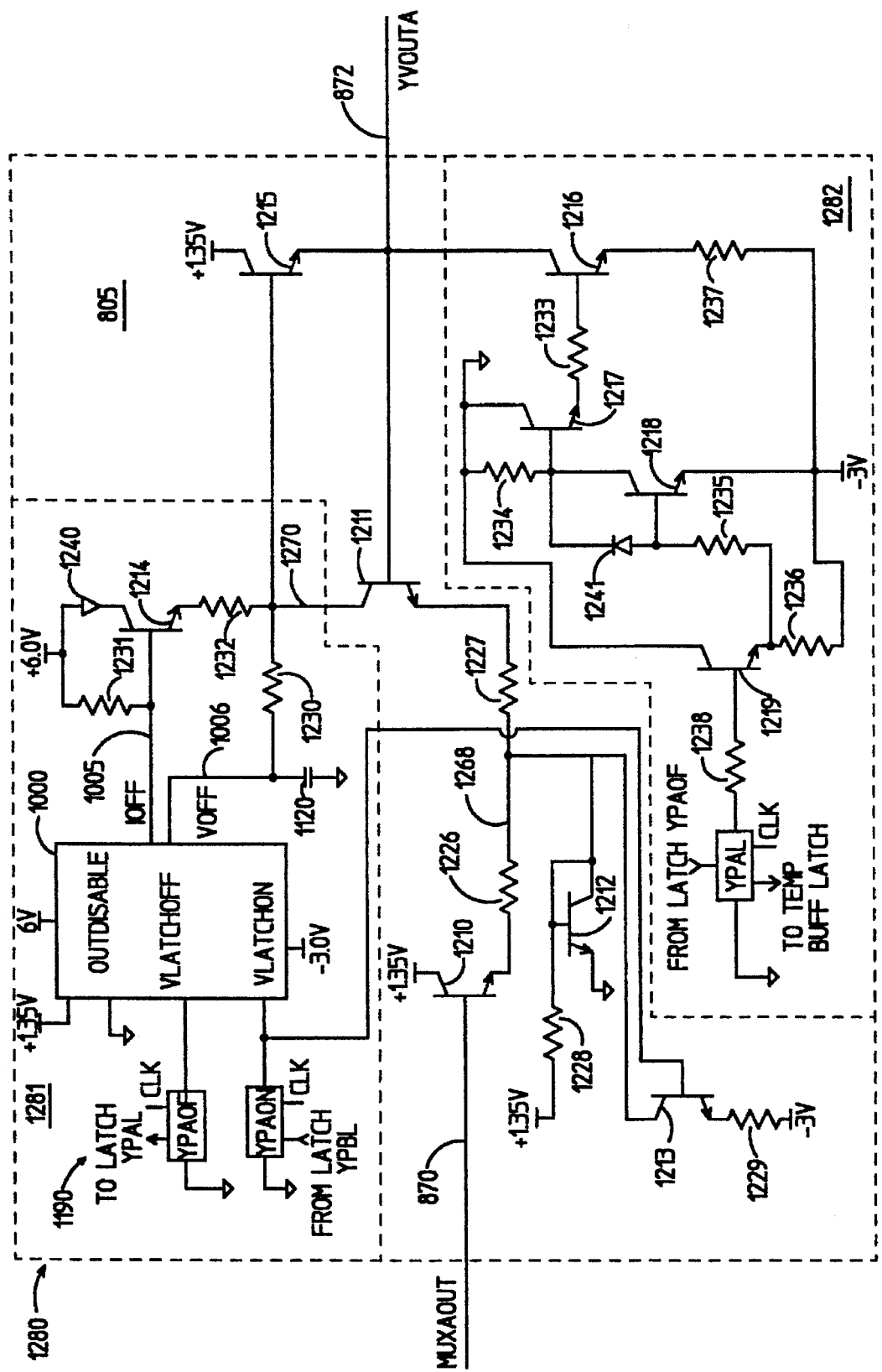
FIG. 12 is a circuit diagram of the programmable output stage of the "Y" integrated circuit chip of FIG. 8.

Memory 201 is connected to calibration control circuit 122 (FIG. 1) through wire cable 240, preferably a serial interface connection, in cable bundle 160. Integrated circuit chip 202 is connected to channel selection programmer 121 via cable 242 in cable bundle 160, also preferably a serial interface connection. Each of chips 202 through 205 is serially connected to the next chip via a circuit connection such as 243. As will be discussed below, this daisy-chained connection via line 242 and integrated circuit connections such as 243 transfers data sequentially through the latches in the IC's, and thus the latches effectively form a shift register 1190 (FIGS. 11 and 12). Each of probe inputs 105 connect to one of IC inputs 230 through a resistor 209. Each of IC chips 202–205 include an "A" output, 227, 228, 229, and 231, respectively, and a "B" output, such as 232. Each of the "A" outputs connect to probe head output 111 through a resistor 211 and via microstrip 214. Each of the "B" outputs connect to probe head output 112 through a resistor 210 and via microstrip 215. Each microstrip 214, 215 is connected to ground via terminating resistors 213, 212 respectively. Note that in this disclosure ground is indicated by a triangle, such as 220.

Resistors 209 are each preferably 150 ohm resistors imbedded in the printed circuit board of the probe head 103. Resistors 210, 211, 212, and 213, are preferably 50 ohms. Each of IC chips 202–205 is a custom chip referred to herein as a "Y" type chip, or ICY, to distinguish it from the "X" type custom IC chip, or ICX, used elsewhere in the probe system. Both chips will be described in detail below.

Figure 3:
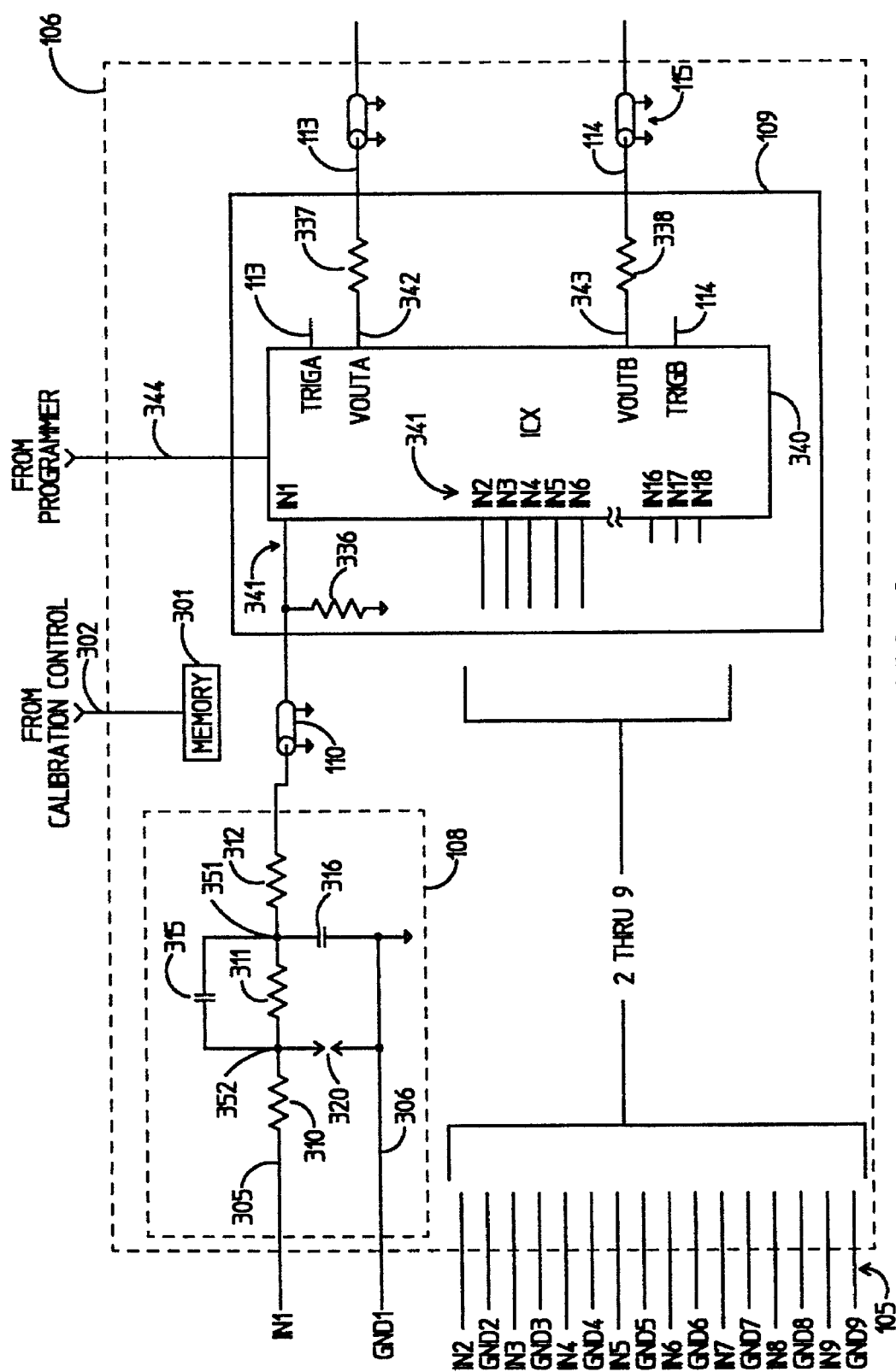
FIG. 3 is a partially block circuit diagram of a probe head for nine general purpose single point probes of the probe system of FIG. 1.

Turning to FIG. 3, general purpose probe 106 is shown. Probe 106 includes memory 301, nine probe tips 108, 100 ohm coaxial cables 110, probe circuit pad 109, and two of coaxial cables 115. For simplicity, only one probe tip 108 and its associated coaxial cable 110 is shown. The other nine are indicated by a bracket "labeled 2 thru 9". Each probe tip 108 includes an input 105 including a input signal line 305 and a ground line 306. Each probe tip also includes tip resistor 310, reverse topology matching resistor 311, trim resistor 312, compensation capacitor 315 and isolation capacitor 316, and spark gap 320. Circuit pad 109 includes resistors 336, 337, and 338, and type "X" custom integrated circuit chip 340.

Input 305 is connected to coaxial cable 110 through resistors 310, 311, and 312 in series. Capacitor 315 is connected in parallel with resistor 311. One side of capacitor 316 is connected to the node 351 between resistors 311 and 312, and the other side is connected to ground. Spark gap 320 is placed between the node 352 between resistors 310 and 311 and ground. Memory 301 is connected to the calibration control module 122 via cable 302. ICX 340 has eighteen inputs 341, though only 9 are used. It has four outputs 113, 114, 342, and 343, the first two of which are trigger outputs, and the latter two of which are analog signal outputs. Coaxial cable 110 connects probe tip 108 and the In1 input of ICX 340. Similarly coaxial cables connect the other probe tips to inputs In2 through In 9 of ICX 340. Each of these inputs is connected to ground through a terminal resistor 336. IC output 342 is connected to one of coaxial cables 115 through resistor 337 while IC output 343 is connected to another one of coaxial cables 115 through resistor 343. Line 344 is the data connection from programmer 121 that goes to the shift register latches in the IC.

Resistors 310, 311,312, 336, 342 and 343 preferably have the values 200 ohms, 19.6 Kohms, 100 ohms, 100 ohms, 50 ohms, and 50 ohms, respectively. Capacitors 315 and 316 are 220 femtofarads and 20 picofarads, respectively. The breakdown voltage of spark gap 320 is preferably about 320 volts. All probe tip components can withstand electrostatic discharge (ESD) voltages up to the spark gap threshold voltage.

Figure 4:
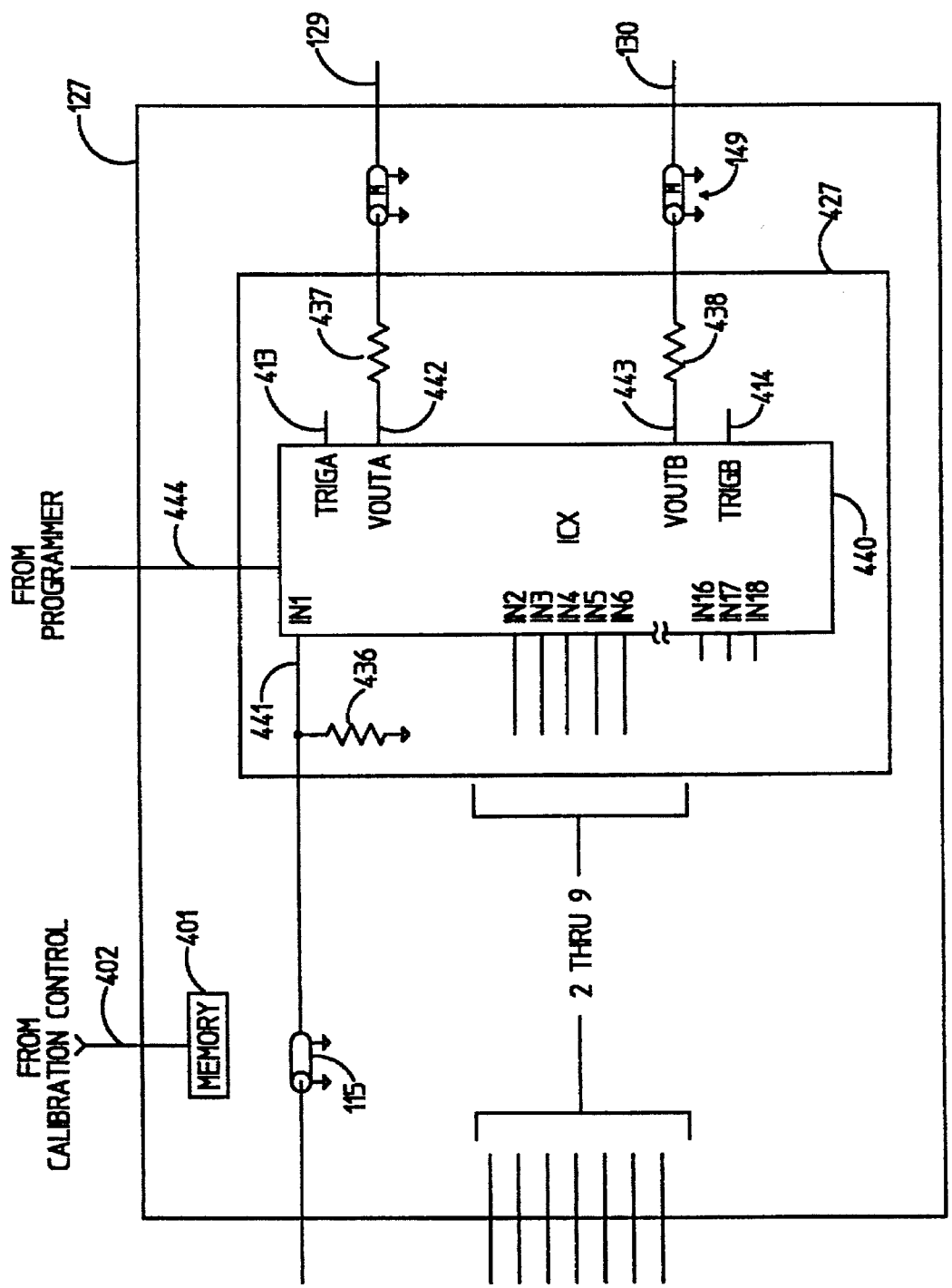
FIG. 4 is a block circuit diagram of the second level multiplexer of the probe system of FIG. 1.

FIG. 4 shows a block circuit diagram of the second level multiplexer 127. It includes calibration data memory 401, which is connected to the calibration control module 122 (FIG. 1) via cable 402. Line 444 is the data line bundled in cable 160 (FIG. 1) which transfers data from the programmer 121 (FIG. 1) to the serial shift register of latches in ICX chip 340, which will be discussed below. Multiplexer 127 also includes resistors 436, 437, and 438 and ICX 440 which are on chip carrier 427. Only the first eight inputs 441 of ICX 440 are used. Each of the first eight inputs is connected to one of the cables 115. Each input is also connected to ground through a terminal resistor 436, which is preferably 50 ohms. Chip ICX 440 has two trigger outputs 413 and 414 which are not used in this embodiment, and two analog outputs 442 and 443, each of which is connected to one of microstrip "coaxial cables"149 through a 50 ohm resistor, such as 437. Microstrips 149 in turn connect to the oscilloscope inputs of the logic analyzer 133.

Figure 5:
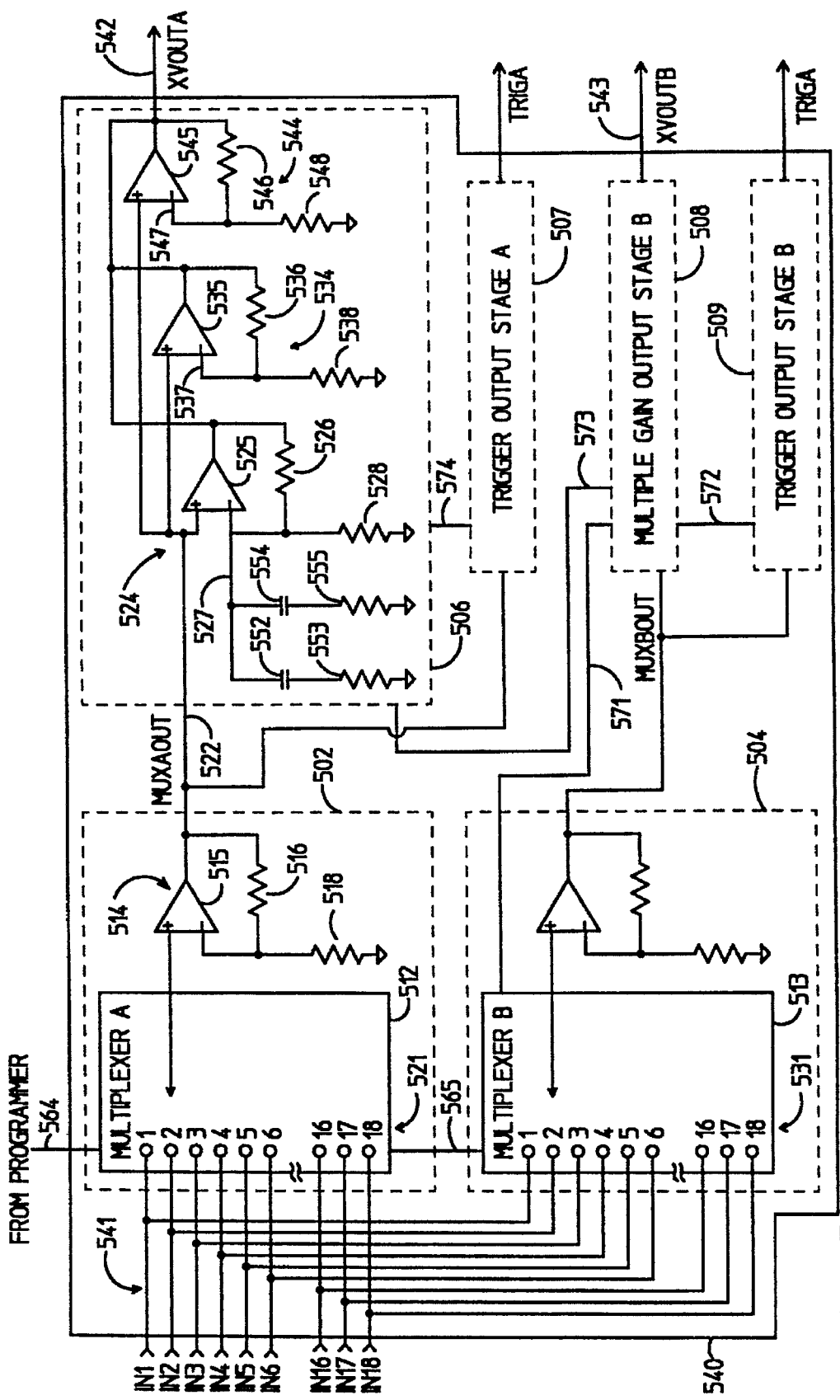
FIG. 5 is a block circuit diagram of the "X" type integrated circuit chip used in the probe system of FIG. 1.

FIG. 5 shows a block circuit diagram of the type "X" integrated circuit 540. It can be divided into two multiplexer amplifiers (muxamps), i.e. an "A" muxamp 502 and a "B" muxamp 504, and four output stages, i.e. multiple gain output stage "A" 506, trigger output stage "A" 507, multiple gain output stage "B" 508, and trigger output stage "B" 509. Each output stage is a multiple gain means, responsive to the gain selection means 144 (FIG. 1), for providing the selected gain to the signals passing through the selected channel(s). Muxamp 502 can be considered to include a multiplexer, such as 512, and a feedback amplifier circuit 514, although as will be seen in FIG. 6, this division is not fully accurate, since in the actual circuit the feedback of amplifier 514 passes through a portion of multiplexer 512. The feedback amplifier circuit 514 includes amplifier 515 and a pair of resistors 516 and 518 which form a voltage divider which determines the gain of the amplifier.

Each of the four output stages 506–508 can be considered to include three feedback amplifiers 524, 534, and 544, each with a different voltage divider which determines its gain. Feedback amplifier 524 includes programmable amplifier 525 and a voltage divider comprising resistors 526 and 528; feedback amplifier 534 includes programmable amplifier 535 and a voltage divider comprising resistors 536 and 538; and feedback amplifier 544 includes programmable amplifier 545 and a voltage divider comprising resistors 546 and 548. In addition, the multiple gain output stages 506 and 508 include cable compensation circuits, such as the circuit in multiple gain output stage 506 comprising capacitors 552 and 554 and resistors 553 and 555. As will be seen below, each of the amplifiers 525, 535, and 545 are programmable in that they can be programmed on or off through the shift register signal that is carried to the output stages 506 and 508 via the lines 571 and 574. The trigger output stages 507 and 509 are the same as the multiple gain output stages, except they do not include the cable compensation capacitors and resistors, since in the applications in which long cables connected to output stages are used the trigger output stages are not used; also, as will be seen below, they do not include the latches that use the shift register signal, but instead utilize the signals from latches in the output stages 506 and 508, respectively via lines 574 and 572, respectively.

The eighteen inputs 541 of the ICX chip 540 correspond to the inputs 341 of chip 340 and 441 of chip 440. Each input is connected both to the eighteen inputs 521 of multiplexer "A" 512 and the eighteen inputs 531 of multiplexer "B" 513. The "A" multiplexer 512 is connected into the shift register via line 564, which corresponds to lines 344 and 444 of the chips 340 and 440, respectively, which provides the data signal from programmer 121. The shift register data signals are passed from multiplexer 512 to multiplexer 513 via line 565, and then to the output stages 508 and 506 via lines 571 and 573. As will be discussed below, each multiplexer, such as 512, connects one of its inputs to the positive input of the corresponding feedback amplifier, such as 514, in response to the signals received on cable 564. The output of amplifier 514 is connected to its negative input through resistor 516 and its negative input is also connected to ground through resistor 518. The output 522 of amplifier 514 provides the MUXAOUT signal which is applied to the positive inputs of amplifiers 525, 535 and 545. Each of the outputs of amplifiers 525, 535 and 545 are connected to its negative input through resistors 526, 536 and 546, respectively. Each negative input of amplifiers 525, 535, and 545 is connected to ground through resistors 528, 538, and 548, respectively. The negative input of amplifier 525 is also connected to ground through capacitor 554 and resistor 555 connected in series, and to ground through capacitor 552 and resistor 553 connected in series. The outputs of amplifiers 525, 535, and 545 are connected to the "A" output 542 of IC 540 and provide the XVOUTA signal. Muxamp 504 and multiple gain output stage "B" 508 are identical to muxamp 502 and multiple gain output stage "B" 506, and similarly provide the signal XVOUTB on output 543. Trigger output stage "A" is connected to the output of amplifier 514 and provides the TRIGA output signal, while trigger output stage "B" 509 is connected to the amplifier output of muxamp 504 and provides the TRIGB output signal.

Preferably, resistors 516, 518, 526, 528, 536, 538, 546, 548, 535, and 555 are 100 ohms, 88 ohms, 125 ohms, 105 ohms, 125 ohms, 105 ohms, 90 ohms, 1.1 Kohms, 420 ohms, and 1.5 Kohms, respectively. Preferably, capacitors 552 and 554 are 1 picofarad and 6 picofarads, respectively. These values result in a gain of 2.1 for amplifier 515, a gain of 2.2 for amplifiers 525 and 535, and a gain of 1.1 for amplifier 545. The gains of the amplifiers are slightly larger than the desired net gain for the system 100, e.g. 2.1 rather than 2, to allow for slight losses elsewhere in the system. That is the selection of the a 2.1 gain factor will result in an approximately net gain of 2 for the system 100.

Figure 6:
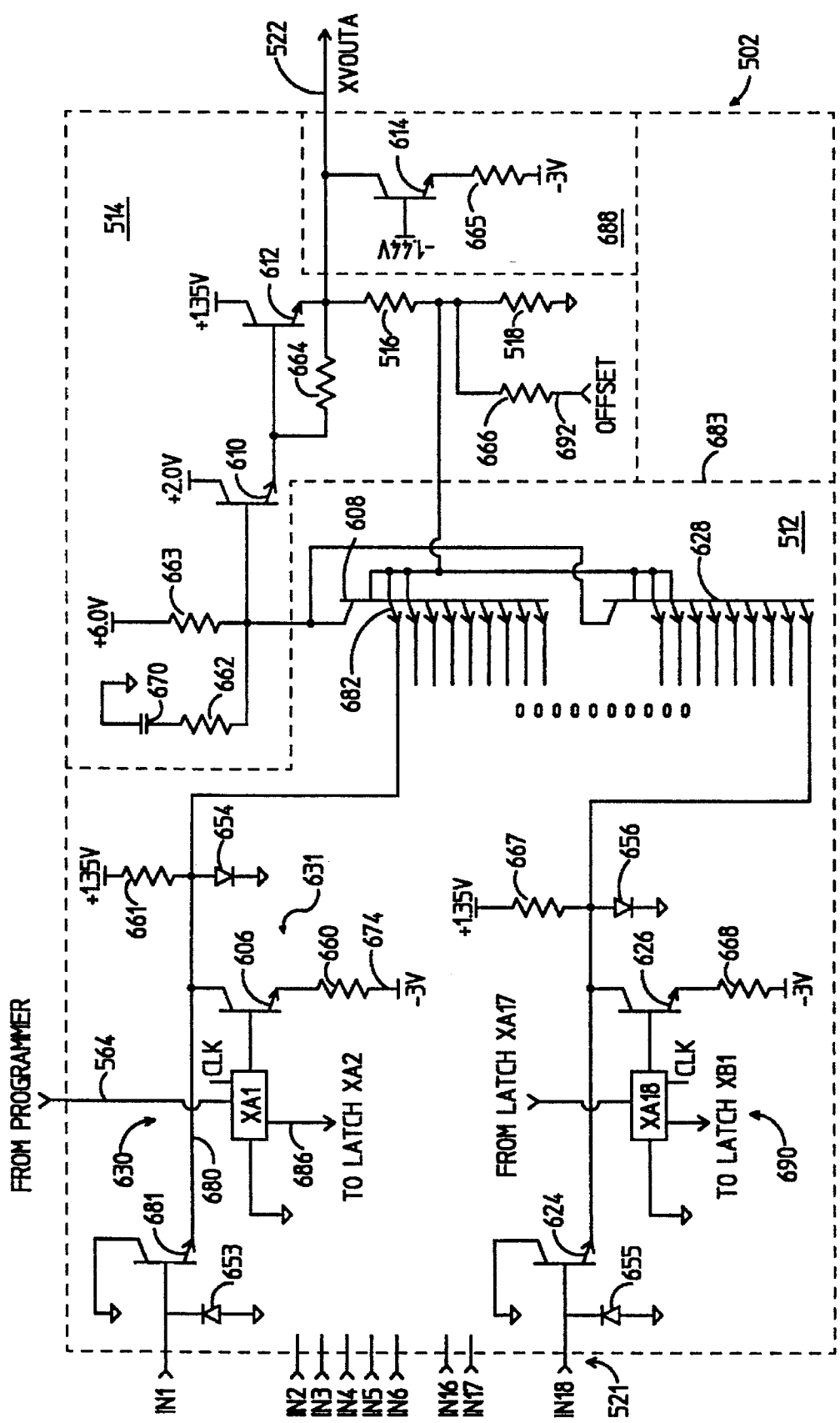
FIG. 6 is a circuit diagram of the multiplexer amplifier in the "X" integrated circuit chip of FIG. 5.

A detailed circuit diagram of the multiplexer amplifier 502 is shown in FIG. 6. Muxamp 502 includes eighteen inputs 521, transistors 604, 606, 608, 610, 612, 614, 624, 626, and 628, latches XA1 through XA18, diodes 653 through 656, resistors 516, 518, and 660 through 668, capacitor 670, and output 522. Preferably, all transistors in this circuit and in other circuits of this disclosure are bipolar NPN transistors. Transistors 608 and 628 are nine emitter transistors. The latches XA1 and XA18, and the other latches discussed below, may be any device having an output that may be latched in either of two states: a "low" or logic "0" state that in this embodiment is preferably about –3.0 volts, and a "high" or logic "1" state that in this embodiment is about +0.0 volts. The latches are labeled with designations, such as XA1 and XA18, that indicate their relative position in the circuit and in the shift registers, 690 and 1190 (FIG.11 ). The first one or two letters before the "A" or "B" indicate the circuit in which the latch is located: if the first letter is an "X", the latch is in the ICX chip, and if the first letter is a "Y" the latch is in the ICY chip. If there is no other letter before the "A" or "B", the latch is in a muxamp; if there is a "G" before the "A" or "B", it is in a multiple gain output circuit, and there is a "P" it means the latch is in a programmable output circuit. The letter "A" or "B" indicates whether the latch is in the "A" channel or "B" channel; if the last symbol is a numeral, it indicates which one the latch is of a series of latches having a similar function in the circuit location given by the first letters; if the last symbol is a letter or letters, this indicates a specific latch having a specific function, such as "ON" (output disable on) or "OF" (output disable off), or "L" (for level shift control), e.g. latch YAL indicates the level shift control latch in the "A" channel muxamp of the ICY chip. Preferably resistors 660 through 668 have the values 125 ohms, 2 Kohms, 500 ohms, 2.3 Kohms, 1 Kohm, 200 ohms, 1.8 Kohms, 2 Kohms, and 125 Kohms. Capacitor 670 preferably has a value of 0.2 picofarads.

Muxamp 502 includes an 18:1 multiplexer 512, which is the circuit to the left of the dotted line 683, a feedback amplifier 514 for driving the signal selected by multiplexer 512 out of the muxamp, and a current source circuit 688 for biasing the output 522. In the implementation shown in FIG. 6, the feedback circuit for amplifier 514 actually passes through transistors 608 and 628 which are part of multiplexer 512. Multiplexer 512 is essentially eighteen amplifiers, such as 630, each of which can be selectively activated by an activation means, such as 631, which comprises a latch, such as XA1, a transistor, such as 606, and a current source, such as 674. Each amplifier comprises two transistors, such as 604 and 608, with their emitters, such as 681 and 682 connected. We shall refer to these connected emitters as an "emitter pair". In the implementation shown, transistor 608 is a nine-emitter transistor, so it acts as the second transistor for the first nine of the amplifiers, while a second nine-emitter transistor 628 acts as the second transistor for the last nine of the amplifiers. The differential amplifier circuit, e.g. the circuit shown between input In 1 and the first emitter of transistor 608, is repeated 18 times in muxamp 502, though only the first and last, i.e. the amplifier circuit for inputs In1 and In18, are shown. As will be clear from the following, each of these amplifier circuits together with the three amplifiers 524, 534, and 535 in the multiple gain output stage, such as 506, plus each of the probe outputs 129 and 130 defines a separate multiplexer channel.

The In1 input is connected to the base of transistor 604 and is also grounded through diode 653, which has its anode connected to ground. In this configuration, diode 653 protects against excessive negative voltages applied to the input in1. Diode 653 begins to turn on when the negative voltage on the input reaches about minus 0.7 volts. Protection against positive voltage excursions is provided by the collector/base junction of transistor 604, which, as known in the art, is essentially a diode. The collector of transistor 604 is connected to ground.

Note that in this disclosure voltage sources are shown as a line with the voltage written next to it, as at 674. The probe power supply 124 (FIG. 1) provides voltages of +6.0 volts, +1.35 volts, and –3.0 volts. Each IC chip also has an on-chip circuit that generates –1.44 volts. Other intermediate voltages are obtained in a conventional manner by placing one or more diodes that attenuate the voltage between the line carrying the appropriate voltage from the power supply 124 and the portion of the circuit where the intermediate power source is shown.

The separate biasing of each channel, i.e. the separate connection of each channel to the power supply through the collector of the first transistors, such as 681, prevents adjacent channels from "talking" via the power supply. Thus, it provides isolation when the channel is off. As mentioned above, the emitter of transistor 604 is connected to the first emitter of transistor 608. The node 680 defined by the latter connection is connected to the collector of transistor 606. The base of transistor 606 is connected to the output of latch XA1. Line 564 applies the shift register data signal to latch XA1, which signal is passed to the next latch via line 686. A clock signal is also applied to clock the latch, as is known in the art. Latch XA1 is also referenced to ground separately from the other latches in the multiplexer to produce an accurate, repeatable bias lever for the control switch comprising latch XA1 and transistor 606. The emitter of transistor 606 is connected to the –3.0 volt voltage source through resistor 660. When latch XA1 goes high it turns transistor 606 on, which provides a current source for the amplifier circuit passing through the first emitter of transistor 608 and comprising transistors 604 and 608, activating this amplifier and thus turning on channel 1 of the "A" multiplexer 512. This electrically connects the input associated with this channel to the selected output 129 or 130 of probe 100.

Node 680 is also connected to ground through diode 654, the cathode of which is connected to ground, and is connected to the +1.35 volt voltage supply through resistor 661. The combination of diode 654 tied to ground and the connection to the +1.35 voltage source through resistor 661 forces node 680, and the emitter pair 681 and 682 to which node 680 connects, to a controlled shut-off voltage when the channel is not connected, and further assists in reducing coupling between the channels. Preferably the controlled shut-off voltage is about 0.75 volts, which reverse biases the base/emitter junctions of transistors 604 and 608 when latch XA1 is off.

In the just discussed manner, the circuit from each multiplexer input through the corresponding emitter of transistors 608 or 628 together with one of the three gain circuits 524, 535, and 545, plus one of the two probe outputs 129 and 130 defines a probe circuit path from the probe input 105 (FIG. 1) that is associated with multiplexer input to the output, 129 or 130, of the probe, which path is referred to herein as a channel. For example, the circuit from probe tip 108 connected to the In6 input of pad 109 (FIG. 1), through the In6 input of multiplexer 512, through the 6th emitter of transistor 608, through the gain amplifier 524, to the output 129 of the probe, defines a unique path through the probe, which path is referred to as channel 6 of the "A1" section of probe head 109.

Returning to the discussion of FIG. 6, the circuit between input In18 and the last emitter of transistor 628 is identical in structure and function as the circuit between In1 and the first emitter of transistor 606, except that the latch XA18 is in a different position in the shift register of latches and thus its function will be determined by the bit in that position. This latter circuit, together with probe output 129, defines the eighteenth channel associated with "A" section. Likewise each of the other circuits between the other inputs In2 through In17 and the corresponding emitter define a probe channel.

The collectors of transistors 608 and 628 are connected to the base of transistor 610, to a +6.0 volt power source through resistor 663, and to ground through resistor 662 and capacitor 670 connected in series. The collector of transistor 610 is connected to a +2.0 volt power source, and its emitter is connected to the base of transistor 612 and the muxamp output 522 through resistor 664. The collector of transistor 612 is connected to the +1.35 power source and its emitter is connected to output 522. The output 522 is also connected to the bases of transistors 608 and 628 through resistor 516 to provide the feedback discussed in connection with FIG. 5. The bases of transistors 608 and 628 are also connected to ground through resistor 578 and to the offset voltage input 692 through resistor 666. The offset voltage is applied from calibration control module 122 (FIG. 1) and provides a means for trimming the muxamp 502 circuit for calibration purposes.

Output 522 also is connected to the collector of transistor 614. The base of transistor 614 is connected to a –1.44 volt power source and its emitter is connected to the –3.0 volt power source through resistor 665. This circuit provides a bias for transistors 610 and 612 at a value that permits that transistors to operate as desired.

Figure 7:
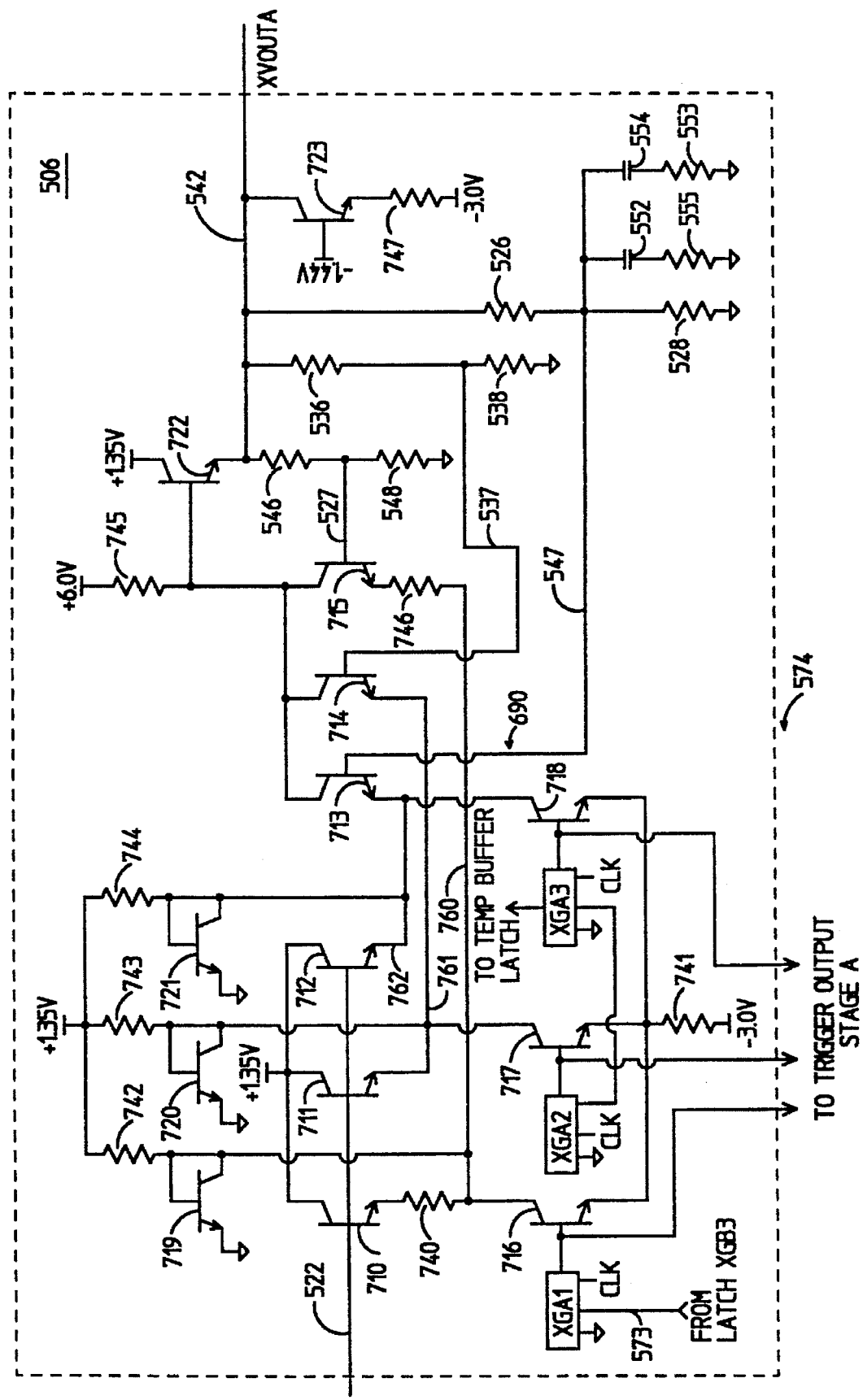
FIG. 7 is a diagram of the multiple gain output stage of the "X" integrated circuit chip of FIG. 5.

The detailed circuit for multiple gain output stage 506 is shown in FIG. 7. Output stage 506 includes transistors 710–723, latches XGA1 –XGA3, resistors 526, 528, 536, 538, 546, 548, 553, 555, and 740–747, and capacitor 552 and 554. Preferably, resistors 740–747 have the values 20 ohms, 135 ohms, 2 Kohms, 2 Kohms, 2 Kohms, 2.7 Kohms, 20 ohms, and 100 ohms, respectively. The values for the other components were given above.

The bases of transistors 710, 711, and 712 are connected to the output stage input 522, while their collectors are connected to the +1.35 volts power source. The emitter of transistor 710 is connected to the emitter of transistor 715 through resistors 740 and 746 in series. The node 760 between the resistors is connected to the collector of transistor 716. The emitter of transistor 711 is connected to the emitter of transistor 714 and to the collector of transistor 717. The emitter of transistor 712 is connected to the emitter of transistor 713 and to the collector of transistor 718. Each of the collectors of transistors 713, 714, and 715 are connected to the +6.0 volts power source through resistor 745 and to the base of output transistor 722. The emitters of transistors 716–718 are connected to the −3.0 volts power source through resistor 741. The outputs of latches XGA1, XGA2, and XGA3 are connected to the bases of transistors 716, 717, and 718, respectively, and also are connected to the base of the corresponding transistor in the corresponding trigger output stage via line 574. Thus, whenever a channel is selected in the multiple gain output stage "A" 506, the corresponding channel is selected in the trigger output stage "A" 507, and the same for multiple gain output stage "B" 508 and trigger output stage "B" 509. Each latch is serially connected along the shift register data line 573, which comes most immediately from the XMB3 latch and ultimately from the programmer 121 (FIG. 1), and, after passing through latches XMA1, XMA2, and XMA3, goes to the latch of the temperature buffer circuit (not shown) in the "X" chip. As discussed above, each latch also has a clock input, and is separately grounded. Similarly to the circuits associated with the latches in FIG. 6, each latch/transistor, such as XGA2/717, provides a current source for the associated amplifier, such as that comprising transistors 711 and 713, which current source can be turned on and off by the latch to control which of the amplifiers 525, 535, or 545 (FIG. 5) that the signal input on line 522 passes through.

Each node 760, 761, and 762 between the emitter pairs of the three amplifiers is connected to the +1.35 volt power source through a resistor, such as 743, and is connected to the collector and base of a transistor, such as 720, which has its emitter connected to ground, in which configuration the transistor, such as 720, acts as a diode. This circuit insures that the base/emitter junction of transistors, such as 711 and 714, is reverse biased when the corresponding latch, such as XGA2, is off, so that these transistors remain off. In addition, this arrangement causes the diodes, such as 720, to turn on when the latch, such as XGA2, is off, and connects the node to ground, which prevents any signal from coupling through the amplifier.

The collector of transistor 722 is connected to the +1.35 volt power supply and its emitter is connected to output 542. The nodes 547, 537, and 527 connected to each of the bases of transistors 713, 714, and 715, respectively, are the nodes connected to the negative input of amplifiers 545, 535, and 525 (FIG. 5), respectively. The connection of the voltage divider resistors 526, 528, 536, 538, 546, and 548 to these nodes was shown in FIG. 5 and discussed with respect to that figure.

The collector of transistor 723 is connected to the output node 542, and its emitter is connected to the −3.0 volt power source through resistor 747. Its base is connected to a −1.44 volt power source. This circuit provides biasing for output transistor 722.

From the above, it can be seen that the multiple gain output stage 506 comprises three programmable amplifiers 524, 525, and 526, which share an output transistor 722. For example, programmable amplifier 535 comprises transistors 711, 714, and 717, latch XGA2, resistors 741 and 743, and diode 720, together with output transistor 722. The feedback that makes this amplifier 535 a feedback amplifier 534 is provided through resistor 536 and node 537, and the voltage division that determines the gain of amplifier 534 is provided by resistors 536 and 538. The amplifier 535 is programmed by the data applied to the shift register that includes latch XGA2. If latch XGA2 holds a logic "0" the latch and programmable amplifier 535 is programmed to be OFF and if latch XGA2 holds a logic "1" the latch and programmable amplifier 535 are programmed to be ON. Similarly the latch XGA1 determines whether amplifier 725 is on or off, and latch XGA3 determines whether amplifier 745 is on or off.

Figure 8:
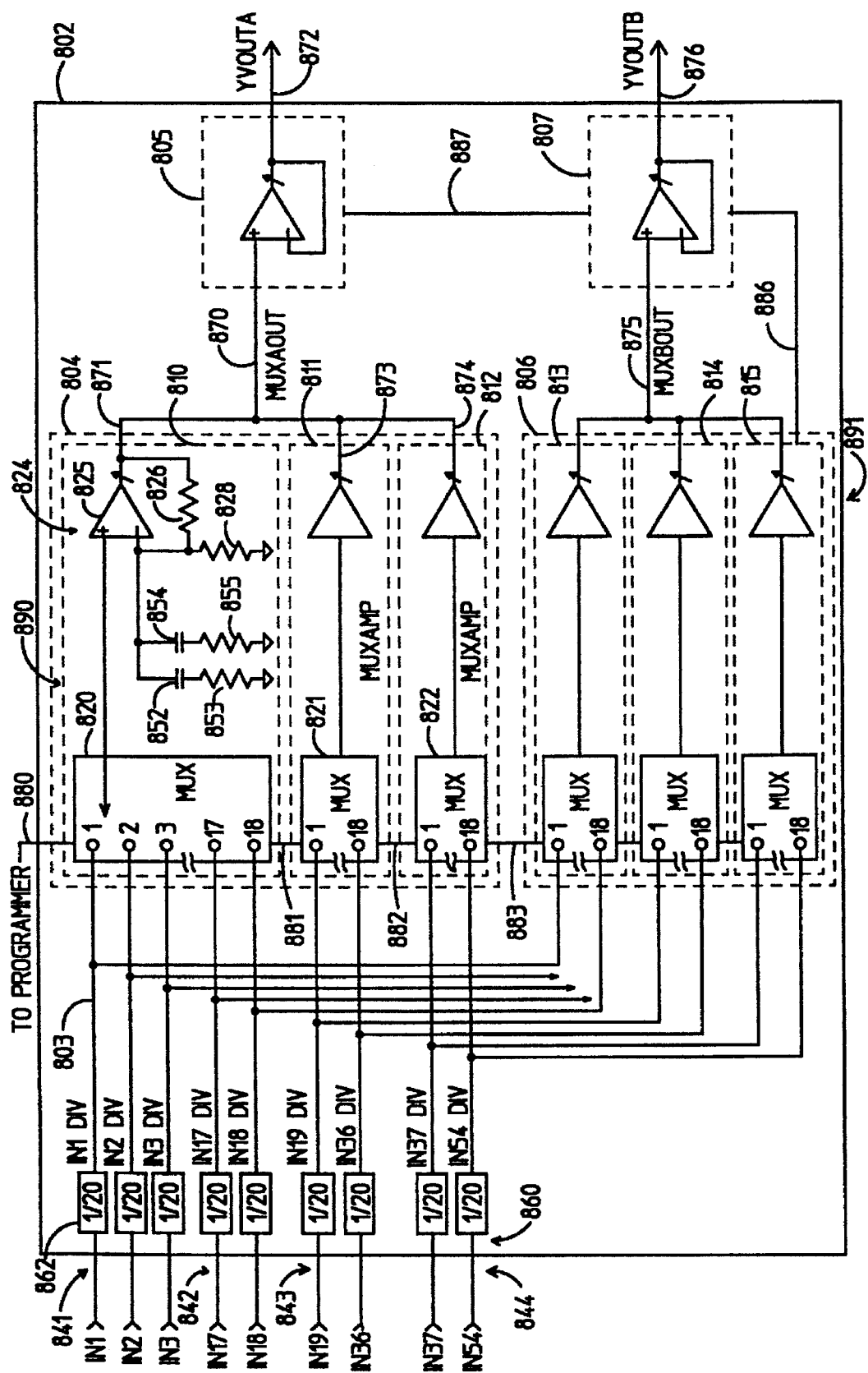
FIG. 8 is a block circuit diagram of the "Y" type integrated circuit chip used in the probe system of FIG. 1.

FIG. 8 is a block circuit diagram of a type "Y" integrated circuit chip 802. This is the IC 202–205 in FIG. 2. ICY 802 includes an "A" channel muxamp 804 and programmable output stage 805 and a "B" channel muxamp 806 and programmable output stage 807. The "A" and "B" channels are identical except in the order in which their latches are connected, which latches and connections will be discussed below. Thus, only the "A" channel will be described in detail. Muxamp "A" 804 is a 54:1 muxamp that includes three 18:1 muxamps 810, 811, and 812. Again, each of these three muxamps are identical, except for the order of the latch connections, and thus only muxamp 810 will be discussed in detail. Muxamp 810 can be thought of as an 18:1 multiplexer 820, a feedback amplifier 824, and a cable compensation circuit 850 comprising resistors 853 and 855 and capacitors 852 and 854. Feedback amplifier 824 includes programmable amplifier 825 and a feedback and voltage divider circuit comprising resistors 826 and 828. The connections of the feedback amplifier 824 and cable compensation components are the same as were described in connection with feedback amplifier 524 and its associated cable compensation circuit in FIG. 5. The values of resistors 852 through 854 are 1.14 pf, 350 ohms, 6.7 pf, and 1.5 Kohms, respectively. Further, in this circuit resistor 826 is 60 ohms and resistor 828 is 180 ohms, which results in gain of 1.1 for feedback amplifier 824.

ICY chip 802 includes two stages, an "A" stage 890, and a "B" stage 891, which are identical. Chip 802 includes fifty-four inputs 841, each connected to a corresponding probe input 105 (FIG. 2) identified by the same identifier, i.e. In1, In2, etc. For simplicity only nine inputs 841 are shown. The inputs 841, and likewise the corresponding probe inputs 105, are divided into three groups, 842, 843, and 844, each group being connected to one of multiplexers 820, 821, and 822. Each input is connected to a 1/18 input divider, such as 862, and each input divider is connected to one input of "A" muxamp 804 and one input of "B" muxamp 806. Each of the "A" and "B" multiplexing stages, 890 and 891, has an output 870 and 875, respectively. The output 871 of muxamp 804 is connected to the input of programmable output stage 805, and the output 872 of the programmable output stage provides the ICY output signal YVOUTA. Likewise the output 876 of the output stage 807 provides the output signal YVOUTB. The data signal is provided to the first 18:1 multiplexer 820 on line 880 from the programmer 121 if this is the first chip, such as 202, in a probe head, or from the last latch in the preceding chip if this is not the first ICY chip in the probe head. The data feeds from the last latch in multiplexer 820 via line 881 to the first latch in the next multiplexer 821, then after passing through all the latches in multiplexer 821, it feeds to the next multiplexer in the "A" channel via line 882, then to the multiplexers in the "B" channel on line 883, thence to the "B" channel output stage 807 via line 886, and then to the "A" channel output stage via line 887. The outputs 871, 873, and 874 of multiplexer amplifiers 810, 811, and 812 are daisy-chained together and connect to a common output 870 which is the input to the programmable output stage 805.

Figure 9:
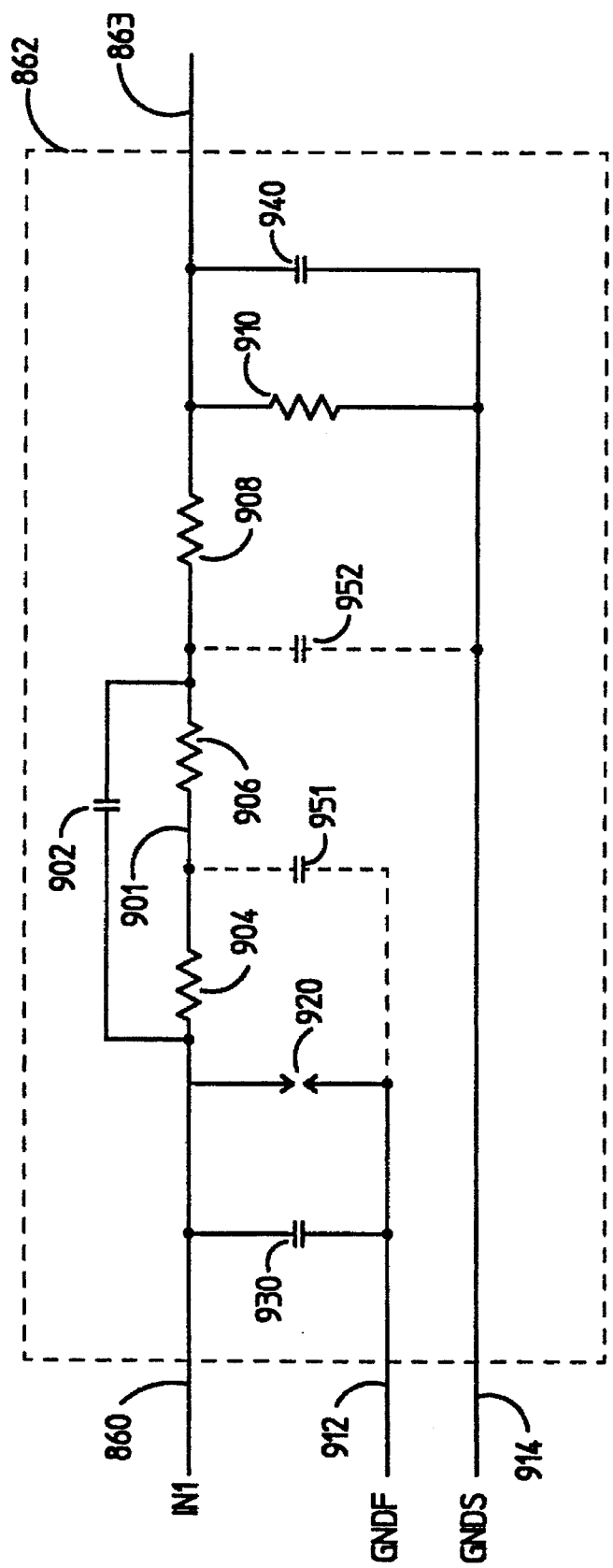
FIG. 9 is a circuit diagram of the input divider portion of the "Y" integrated circuit chip of FIG. 8.

FIG. 9 shows a detailed circuit diagram of the input divider 862. An important feature of this divider is that it is on the ICY chip 802, which allows one to take advantage of IC geometries that allow large numbers of high impedance networks in small areas and still get low coupling. Input divider 862 includes input 860, GndF ground line 912, GndS ground line 914, compensation capacitor 902, resistors 904, 906, 908, and 910 and spark gap 920. The GndS ground is the "sense" ground or conventional ground of the bonding pad on which the IC is located, and the GndF ground is a special current return ground to remove high frequency current from the pad. Other capacitances that are not actual devices within the divider network, but which must be considered so that the divider functions as desired, are shown in FIG. 9. These include the pad capacitance 930, which is the net output capacitance of the bonding pad on which the chip is located, amp capacitance 940, which is the input capacitance of the muxamp to which the output 863 of the input divider 862 connects, stray capacitance 951 which is the stray capacitance between the input 860 and the GNDF ground 912, and stray capacitance 952, which is the stray capacitance between the input 860 and the GndS ground 914. The lines to the latter two capacitances are dotted to indicate that these are parasitic capacitances.

The input voltage divider network comprises resistors 904, 906, and 908 in series between the input 860 and the output 863 of the input divider 862, plus resistor 910 connected between output 863 and GndS ground 914. Capacitor 902 is connected in parallel with resistors 904 and 906 between the input 860 and the node 903. This capacitor compensates for the stray capacitances 951 and 952 and the amp capacitance 940. Spark gap 920 is connected between the input 860 and the GndF ground 912. The pad capacitance occurs between the input 860 and the GndF ground 912, the stray capacitance 951 is indicated between the node 901 and the GndF ground 912, and the stray capacitance 952 is indicated between the node 903 and the GndS ground 914. The amp capacitance occurs between the output 863 and the GndS ground.

Preferably, .capacitance 902 is 70 femtofarads, and resistors 904, 606, 908 and 910 are 7.6 Kohms, 3.8 Kohms, 7.6 Kohms, and 1.1 Kohms, respectively. The breakdown voltage of spark gap 920 is preferably 320 volts. It is an important feature of the ICY that all electronic components of the input divider 862 can withstand voltages up to and slightly in excess of the spark gap breakdown voltage. In the preferred embodiment, pad capacitance 930 is 125 femtofarads, stray capacitance 951 is 20 femtofarads, stray capacitance 952 is 10 femtofarads, and amp capacitance 940 is 120 femtofarads.

The total input impedance of input divider circuit 862 is the sum of the three resistors 904, 906, 908, and 910 which totals 20.1 Kohms. A high input impedance is important in an analog probe, since it prevents the probe circuit from interacting with the circuit under test. However, at a certain point, the input divider resistance will be so high that the signal passing through the probe is too low for good signal integrity. Moreover, when so many inputs are in such a small area, i.e. when the input is very dense, it is difficult to provide high input impedance with low coupling between the channels. It is an important feature of the invention that it combines a high input impedance for each of more than a hundred inputs with high signal integrity.

Figure 10:
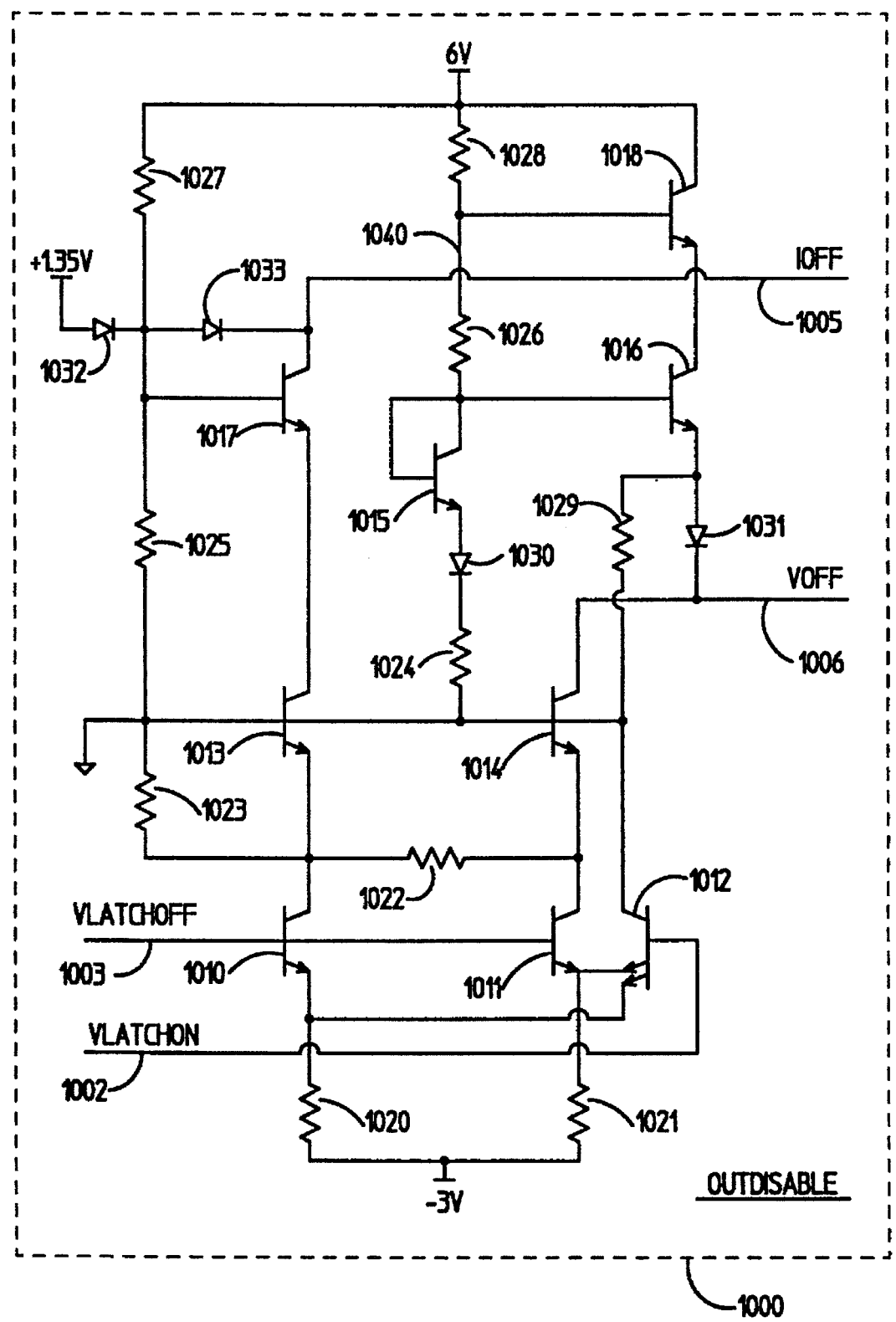
FIG. 10 is a diagram of the outdisable circuit in the "Y" integrated circuit of FIG. 8.

FIG. 10 shows a detailed circuit diagram of the outdisable circuit 1000 which forms part of both the feedback amplifier 824 (FIG. 11) in the muxamp circuit and the programmable amplifier circuit 805 (FIG. 12). This circuit provides a current IOFF on its output 1005 and a voltage VOFF on its output 1006 in response to signals VLATCHON and VLATCHOFF placed on its in puts 1002 and 1003, respectively. Outdisable circuit 1000 includes transistors 1010–1018, resistors 1020–1020, and diodes 1030–1033. Transistor 1012 is a two emitter transistor. The input 1003 is connected to the bases of transistors 1010 and 1011. The input 1002 is connected to the base of transistor 1012. The emitters of transistors 1010 and 1011 are connected to one of the emitters of transistor 1012 and to the −3.0 volt power source through resistors 1020 and 1021, respectively. The collector of transistor 1012 is connected to ground. The collectors of transistors 1010 and 1011 are connected through resistor 1022. The collector of transistor 1010 is also connected to the emitter of transistor 1013 and to ground through resistor 1023, while the collector of transistor 1011 is also connected to the emitter of transistor 1014. The bases of transistors 1013 and 1014 are connected to ground. The collector of transistor 1014 is connected to output 1006. The collector of transistor 1013 is connected to the emitter of transistor 1017. The base of transistor 1017 is connected to ground through resistor 1025, to its collector through diode 1033, which has its cathode connected to the collector, to the +1.35 volts power source through diode 1032, which has its anode connected to the power source, and to the 6.0 volt power source through resistor 1027. The collector of transistor 1017 is also connected to output 1005. The emitter of transistor 1015 is connected to ground through diode 1030 and resistor 1024 in series, with the anode of the diode connected to the emitter. The emitter of transistor 1016 is connected to ground through resistor 1029 and to the anode of diode 1031, the cathode of which is connected to output 1006. The bases of transistors 1015 and 1016 are connected to the +6.0 volts power source through resistors 1026 and 1028 in series. The node 1040 between resistors 1026 and 1028 is connected to the base of transistor 1018. The emitter of transistor 1018 is connected to the +6.0 volt power source. The emitter of transistor 1018 is connected to the collector of transistor 1016. Preferably, resistors 1020–1029 have the values 1.1 Kohms, 5.0 Kohms, 32.5 Kohms, 32.5 Kohms, 2.0 Kohms, 97.5 Kohms, 40.0 Kohms, 65 Kohms, 40.0 Kohms, and 32.5 Kohms, respectively. The outdisable circuit provides a voltage VOFF of about 0.1 volts on output 1006 and a current IOFF of about 0.5 milliamps on its output 1005.

The muxamp 810 circuit is shown in FIG. 11. A comparison of this circuit with the circuit of muxamp 502 shown in FIG. 6 will show that the two circuits are in many aspects the same, and thus only the portions of the muxamp 810 circuit that are different than the muxamp 502 circuit will be discussed in reference to FIG. 11. If a resistor or other circuit element shown in FIG. 11 is not discussed either below or reference to FIG. 8. above, its value and function are as given in the discussion of the corresponding circuit element in FIG. 6.

The circuit 810, like circuit 502, includes eighteen amplifiers 1130. Circuit 810 differs from the circuit 502 in that it includes cable compensation circuit 850 and programmable OFF circuit 1110, which latter circuit includes current and voltage control circuit 1111 enclosed by the dotted line in the upper left hand corner of FIG. 11 plus a level shift circuit 1112 in the left hand portion of FIG. 11. To fit the entire circuit 810 on one page and to simply discussion, circuit 1112 is an equivalent circuit of the actual circuit in the preferred embodiment, which actual circuit is shown at 1282 in FIG. 12.

Programmable OFF circuit 1110 includes latches YAON, YAOF, and YAL, outdisable circuit 1000, transistors 1120–1123, capacitor 1128, resistors 1130–1134, and diode 1140. Latches YAON, YAOF, and YAL are connected to the serial data line 1150 which comes most directly from latch YA18, but ultimately from the programmer 121. Latches YAON and YAOF provide the VLATCHON and VLATCHOFF signals to outdisable circuit 1000. As indicated in the discussion of FIG. 10, outdisable circuit 1000 is also connected to the +1.35 volts power source, the +6.0 volts power source, and the −3.0 volts power source, and it provides the IOFF signal on output 1005 and the VOFF signal on output 1006. Output 1006 is connected to ground through capacitor 1128 and to the node 1170 through resistor 1130. Capacitor 1128 and resistor 1130 provide high frequency compensation for the amplifier. Output 1005 is connected to the base of transistor 1120. The base of transistor 1120 is connected to the +6.0 volts power source through resistor 1131. The collector of transistor 1120 is connected to the cathode of diode 1140, and the anode of the diode is connected to the +6.0 volt power source. The emitter of transistor 1120 is connected to the node 1170 which is connected to the collector of nine-emitter transistor 1160. The node 1170 is also connected to the base of transistor 1121, which performs a similar function as transistor 610 in FIG. 6, except that its OFF state is more closely controlled by circuit 1110. The output of latch YAL is applied to the base of transistor 1123, which together with resistor 1134, performs a similar function as transistor 614 and resistor 665 in FIG. 6, except that the function of transistor 1123 depends on the state of latch YAL. Offset input 1192 is connected to feedback node 1108 through resistor 1135. Preferably, capacitor 1128 has a value of 0.3 picofarads, and resistors 1130–1135 have the values 500 ohms, 14 Kohms, 2.0 Kohms, 1 Kohm, 200 ohms and 720 ohms.

The function of the circuit 1110 is to keep transistors 1121 and 1122 off when latches YA1, YA2, and all the other latches associated with the inputs In1 through In18 are off, that is, when no input of multiplexer 810 is selected. Since, in a typical application as shown in FIG. 2, the outputs, such as 210, of a number of ICY chips, such as 202–205, are daisy-chained together on a simple 50 ohm microstrip, such as 215, a chip output 210 that is off will see voltages on the microstrip due to the output from another chip that is on. Turning back to FIG. 11, when the latches YA1, YA2, etc. associated with the inputs 841 are all off, without circuit 1110, node 1170 would rise to approximately +2.5 volts, which, in combination with some voltages that can appear on output 871, could turn on transistors 1121 and 1122. The IOFF current applied to the base of transistor 1120 holds this transistor off and ensures that no current flows through the amplifier to or from output 871. With transistor 1120 off, node 1170 would float. The voltage VOFF generated by outdisable circuit 1000 holds node 1170 at about 0.1 volts, which together with the biasing provided by level shift circuit 1112 when latch YAL is on, holds transistors 1121 and 1122 off for any reasonable voltages that can appear on the output 871. Thus the combination of IOFF and VOFF results in output 871 appearing as an open circuit to any circuit connected to it. As will be seen below, this feature allows many IC chips to be daisy-chained to the probe output, greatly increasing the number of channels that can be placed in a probe head utilizing just the two custom IC chips, ICX and ICY.

The preferred embodiment of the circuit for the programmable output stage 805, as well as the other programmable output stages, is shown in FIG. 12. Circuit 805 includes input 870, output 872, latches YPAON, YPAOF and YPAL, transistors 1210–1219, resistors 1226–1238, capacitor 1220 and diodes 1240 and 1241. Input 870 is connected to the base of transistor 1210. The collector of transistor 1210 is connected to the +1.35 volts power source, while the emitter is connected to the emitter of transistor 1211 through resistors 1226 and 1227 connected in series. The base of transistor 1211 is connected to the output 872, while the emitter is connected to node 1270, which is equivalent to node 1170 in the circuit of FIG. 11. The node 1268 between resistors 1226 and 1227 is connected to the collectors of transistors 1212 and 1213, the base of transistor 1212, and the +1.35 volts power source through resistor 1228. The emitter of transistor 1212 is connected to ground. The emitter of transistor 1213 is connected to the −3.0 volts power supply through resistor 1229. The base of transistor 1213 is connected to the output of latch YPAON.

The circuit 1280 comprising the current and voltage control circuit 1281 enclosed by the dotted lines in the upper left portion of circuit 805 and the level shift circuit 1282 enclosed by the dotted lines in the lower right portion of circuit 805 performs the same function as the programmable OFF circuit 1110 in FIG. 11. Circuit 1281 is the same as the circuit 1111 enclosed by the dotted lines in the upper left hand portion of FIG. 11, and thus will not be discussed again. Circuit 1282 shows the actual implementation of the equivalent level shift circuit 1112 in FIG. 11. The collector of transistor 1216 is connected to the output 872, its emitter is connected to the −3.0 volts power source through resistor 1237, and its base is connected to the emitter of transistor 1217 through resistor 1233. The collector of transistor 1217 is connected to ground and its base is connected to the collector of transistor 1218, to ground through resistor 1234, and to the cathode of diode 1241, the anode of which is connected to the base of transistor 1218 and to the emitter of transistor 1219 through resistor 1235. The emitter of transistor 1219 is connected to ground through resistor 1238, and its collector is connected to ground. The base of transistor 1219 is connected to the output of latch YPAL through resistor 1238. Resistors 1226–1238 preferably have the values 20 ohms, 20 ohms, 1.89 Kohms, 125 ohms, 500 ohms, 14 Kohms, 2.05 Kohms, 250 ohms, 14 Kohms, 7 Kohms, 14 Kohms, 250 ohms, and 7 Kohms, respectively. Capacitor 1220 preferably has the value of 0.2 picofarads.

Like the muxamp circuits 502 and 810 of FIGS. 6 and 11 and the multiple gain output stage 506 of FIG. 7, the programmable output stage circuit 805 is essentially a feedback amplifier formed by joining an emitter pair, i.e the emitters of two transistors 1210 and 1211, with the feedback provided by means of another transistor 1215. Like the slightly more complex amplifiers in the previous figures, amplifier 805 can be turned on or off by turning on or off a current source connected to the node 1268 between the emitter pair. And like the previous circuits the current source is controlled by the output of a latch, YPAON. Unlike the previous circuits, however, circuit 805 does not include a number of different emitter pair amplifiers that can be activated by different current sources controlled by a number of different latches. Instead there is just one emitter pair amplifier which is either off or on. In addition, similarly to the situation when all emitter pair amplifiers in circuit 810 (FIG. 11) are off, when the emitter pair amplifier of circuit 805 is off, an additional circuit 1280 holds the output in a high impedance, no current state that looks like an open circuit to external circuits. Thus the output stage 805 is programmable to be either ON or OFF, and when OFF, looks like an open circuit.

Referring to FIG. 1, the probe 100 is programmed as follows. Assuming that probe head 102 is being programmed, the input or inputs 105 to be connected to output 129 and output 130 are selected by turning dials 145 or by inputting the information with keyboard 142. Input means 140 responds by providing electrical signals to channel selection programmer 121, which utilizes microprocessor 125 and memory 126 to output serial data on cable 160 to shift a series of data bits through all the latches, such as YA1, YA2 through YAL in circuit 810 (FIG. 11) and YPAON, YPAOF, and YPAL in circuit 805, in probe head 102. As indicated above the latches, as a whole, essentially form a shift register 1190, and, like conventional shift registers, the data shifts from one latch to the next with each clock pulse. The data goes from the first ICY chip to the last in each probe head, and within each ICY chip it goes from latch 1 to 18 in the first "A" channel muxamp 810 (FIG. 8), then to the three outdisable latches YAON, YAOF, and YAL in the first "A" muxamp, then to the three outdisable latches YAON, YAOF, and YAL in the first "B" channel muxamp 813, then to latches 1–18 in the "B" channel muxamp 813, then to latches 1–18 in the 2nd "A" channel muxamp 811, then to the three outdisable latches in muxamp 811, the three outdisable latches in the 2nd "B" channel muxamp 814, latches 1–18 in the muxamp 814, then to latches 1–8 in the third "A" channel muxamp 812, the outdisable latches in muxamp 812, the outdisable latches in the third "B" channel muxamp 815, latches 1–18 in the muxamp 815, then to latches YPAON, YPAOF and YPAL in the "B" channel programmable output stage 807, then to the latches YPAON, YPAOF, and YPAL in the "A" channel programmable output stage, and finally to the latch that activates the temperature sensing buffer (not shown) in the chip.

Assume for example, it is selected that input 7 in probe head 102 is to be connected to the "A" output of probe head 102 and input 239 in probe head 102 is to be connected to the "B" output. Since there are 240 inputs in probe head 102, then there will be 5 ICY chips, but only the first 24 of the 54 inputs in the fifth ICY chip will be used. Then programmer 121 shifts data through the latches until the latch associated with the eighth input of the first multiplexer amplifier 810 (FIG. 11) in the "A" channel of the first ICY chip in the probe head and the latch associated with the 5th input in the 2nd muxamp 814 in the "B" channel (FIG. 8) in the fifth ICY chip hold a logic "1" and all the other input latches YA1, YA2, etc. in the probe head hold a logic "0". In addition, the latch YAON in the first "A" channel muxamp 810 in the first ICY chip and the latch YAON in the second "B" channel muxamp 814 in the fifth ICY chip in the probe head 102 will hold a logic "1", the other latches YAON in all the other muxamps in the probe head 102 will hold a logic "0", the latches YAOF and YAL in the first muxamp 810 in the "A" channel in the first ICY chip and the same latches in the 2nd muxamp 814 in the "B" channel in the fifth ICY chip will hold a logic "0", and the other latches YAOF and YAL in all the other muxamps in all the other ICY chips in the probe head will hold a logic "1". Further, in the output stage circuit 805 (FIG. 8) in the "A" channel of the first ICY chip in the probe head and in the programmable output stage 807 in the "B" channel of the fifth ICY chip, the latch YPAON (FIG. 12) will hold a logic "1" and the laches YPAOF and YPAL will hold a logic "0", and in all the other programmable output stages of the five ICY chips the latch YPAON will hold a logic "0" and the latches YPAOF and YPAL will hold a logic "1". If no input in probe head 102 is selected, then the data is shifted through the shift register until all latches YA1, YA2, etc. hold a logic "0", latches YAON and YPAON hold a logic "0", and latches YAOF, YAL, YPAOF, and YPAL hold a logic "1". This places the outputs 115 of probe head 102 in high impedance, no current state that looks like an open circuit.

Each probe head 102–104 and pad 109 has its own shift register; thus each probe head and pad may be programmed independently of the other probe heads. For each probe head and pad, the selection of which of the inputs is to be connected to which of the outputs is made with input means 140 and the channel selection programmer 121 outputs a string of bits to the shift register 690 if it is a pad including an ICX chip or 1190 if it is a probe head using ICY chips, which string of bits activates or deactivates the latches as appropriate to connect the selected input or inputs with the selected output or outputs and to leave the outputs, such as 871, of the muxamps, such as 810, the outputs, such as 872, of the ICY chips, such as 802, and the outputs, such as 111, of the probe heads, such as 103, for which no inputs have been selected, in a high impedance, no current state which appears to an external circuit as an open circuit.

In the case of the pad 109, the gain may be selected also. When programming the ICX chip 340 in pad 109, the order of the latches in the shift register 690 is: latches 1–18 in the "A" channel muxamp 502, i.e. the latches XA1 through XA18 in FIG. 6, then latches 1–18 in the "B" channel muxamp, then the three latches in the "B" channel multiple gain output stage 508, then the latches XGA1, XGA2, and XGA3 (FIG. 7) in the "A" channel multiple gain output stage 506, then the temperature buffer latch (not shown).

After programming all the probe heads 102–104 and the pad 109, or at least those that need to be reprogrammed, the second level multiplexer 127 may be programmed. Again the input or inputs to be connected are selected and the output or outputs to which each selected input is to be connected are also selected. In this case, one of the three available gains, which, in the preferred embodiment are 1.1, 2.2, or 2.2 with cable, are also selected using gain selection means 146. Programmer 121 again outputs a string of bytes to the ICX chip 440 in the second level multiplexer 127, with the string passing through the latches 690 in the order given above for the ICX chip, which bytes activate or deactivate the latches to electrically connect the selected input or inputs to the selected output or outputs, with the gain selected for each output.

At this point the probe 100 has electrically connected either: one of the inputs 105 (FIG. 1) or probe tips 108 to one of the outputs 129 or 130, one of the inputs 105 or probe tips 108 to both outputs 129 and 130, or one of the inputs 105 or probe tips 108 to one output 129 or 130 and another of the inputs 105 or probe tips 108 to the other output. Nothing more needs to be done to pass a signal from the selected input(s) to the selected output(s) over a wide band width and with high signal integrity. To better understand how this occurs, we refer to FIGS. 1, 2 and 8. Assume that input 55 (FIG. 2) is electrically connected through to output 129 (FIG. 1) and that no other input in probe head 103 is selected. Then, the third input in the first muxamp in the second ICY chip in probe head 103 will pass a signal to the chip output 872 and all the other muxamps will be in a high impedance, no current state that appears as an open circuit to output amplifiers 805 and 807. Thus the signal passes out of the "A" output of the chip 203 with no interference from signals on the inputs of the other muxamps, and the output "B" of chip 203 appears to the microstrip 112 (FIG. 2) as a high impedance, no current open circuit. Further since all the other outputs from the other chips 202–205 are in high impedance, not current, open circuit condition, then the signal from input 56 passes out of the chip on output 111 with no interference from any signals that may be on the other inputs. Further, output 112 looks to external circuits as a high impedance, no current open circuit. In this manner, a simple daisy-chained connection of muxamps on one level, chips on another level, and probe heads on a third level, can effectively be used to electrically connect any of a large number of probe inputs to one or both of two probe outputs with high band width and high signal integrity.

Figure 13:
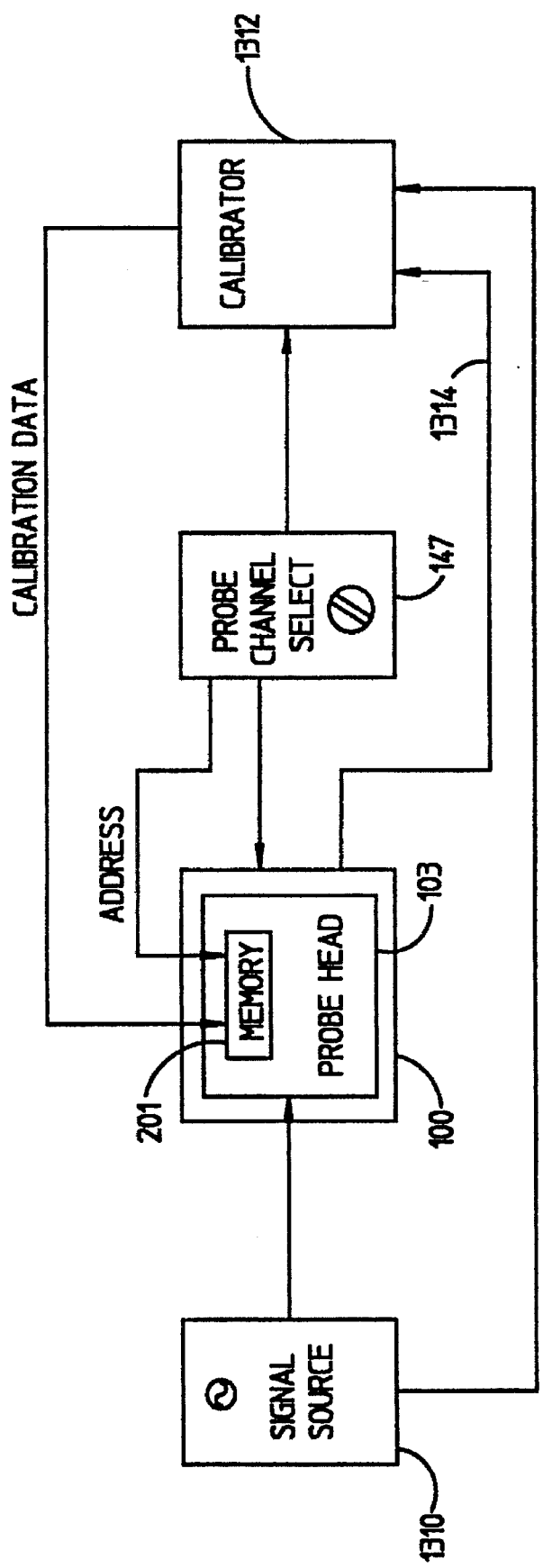
FIG. 13 is a block diagram of the preferred embodiment of a calibration circuit according to the invention for calibrating the probe system of FIG. 1.

Another feature of the invention that contributes to the high band width and high signal integrity is that each channel can be independently and automatically calibrated any time the user desires. Turning to FIG. 13, the calibration system is shown. It comprises a high-accuracy known signal source 1310 and a calibrator 1312. A signal from signal source 1310 is applied to the inputs of probe head 103 and is passed to calibrator 1312. For simplicity, only one probe head 103 is shown, since each is calibrated independently, though it should be understood that the rest of the probe system 100 is included. The signal is passed from the probe head 100 to the calibrator 1312 via line 1314. The probe channel selection means 147, which includes selection means 143, gain selection means 144, and channel selection programmer 121 (FIG. 1), selects a channel in probe head 103 and informs the calibrator 1312 of which channel is selected. It is understood that by "probe channel" is meant the entire channel from the selected input 105 to the selected one of outputs 129 and 130, including the one of the three gain selection channel portions.

Figure 15:
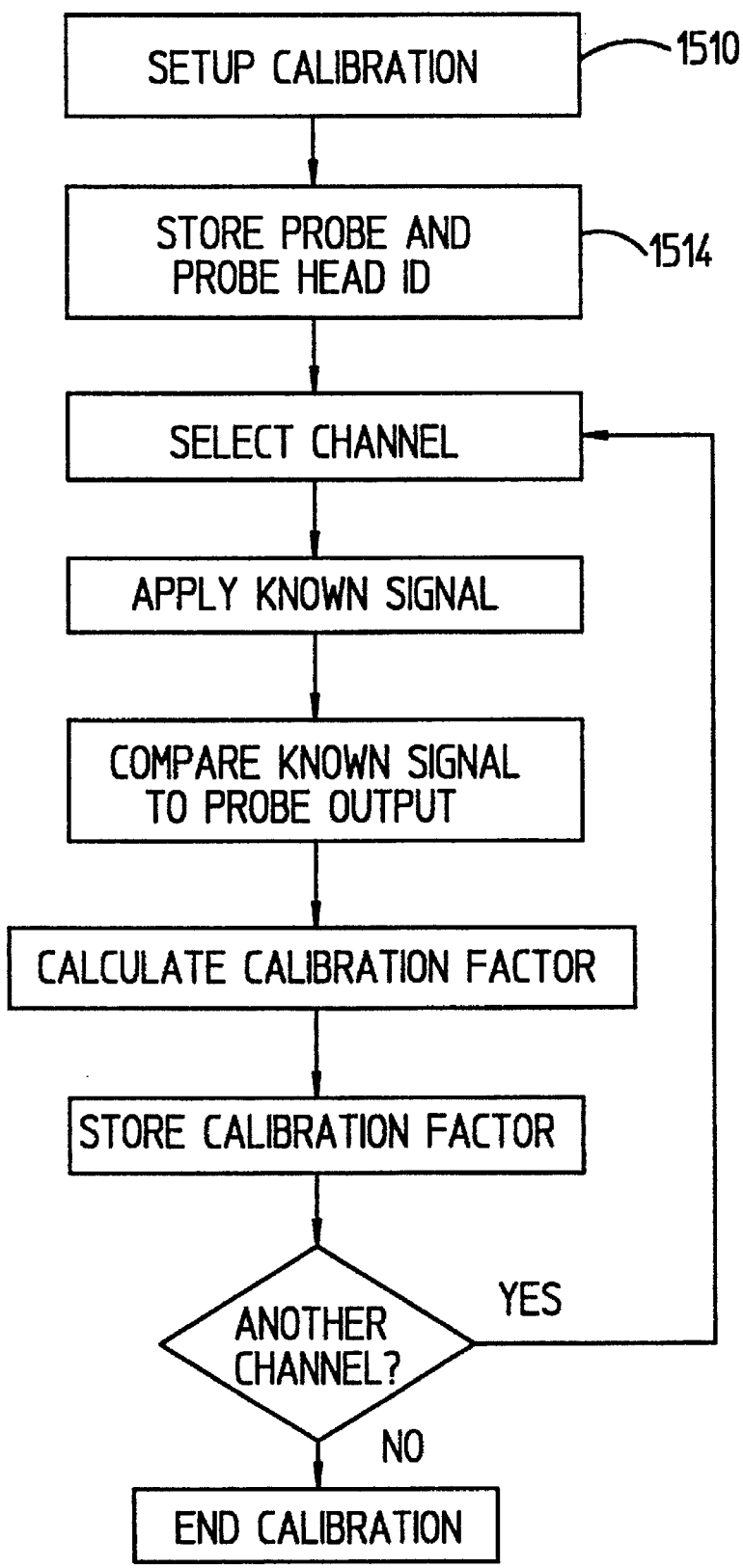
FIG. 15 is a flow chart of the calibration process using the circuit of FIG. 13.

The method of calibration is shown in a flow chart in FIG. 15. In step 1510 the calibration system is set up, warmed up, and calibrated, the signal from signal source 1310 is applied to the probe 100, and initial general calibration of the probe as a whole is performed. Then in step 1514, the probe and probe head identification information (probe ID) are stored on the memory 201, if it has not already been so stored. This ID includes the probe and probe head serial numbers, information relating to the set up of the main frame 133 for the specific probe and probe head, and calibration information related to the probe in general. The first channel in the probe head 103 is selected, and the known signal is applied to the channel and calibrator 1312. The calibrator 1312 compares the signals received from the signal source 1310 with the signal received from the probe 100, calculates a calibration factor which will correct the signal from the probe 100 to the signal from the source 1310, and stores the channel identification with the calibration factor in memory 201 in probe head 103. This is then repeated for the next channel until all of the channels in probe head 103 have been calibrated. Then the process starts over with the next probe head which will have its own memory. At the end of the calibration, each probe head, pad circuit, and second level multiplexer circuit has stored in its memory information which identifies the probe head or pad circuit and the probe of which it is a part, and permits the accurate correction of output to adjust for even very small variations that occur during the manufacturing process.

Figure 16:
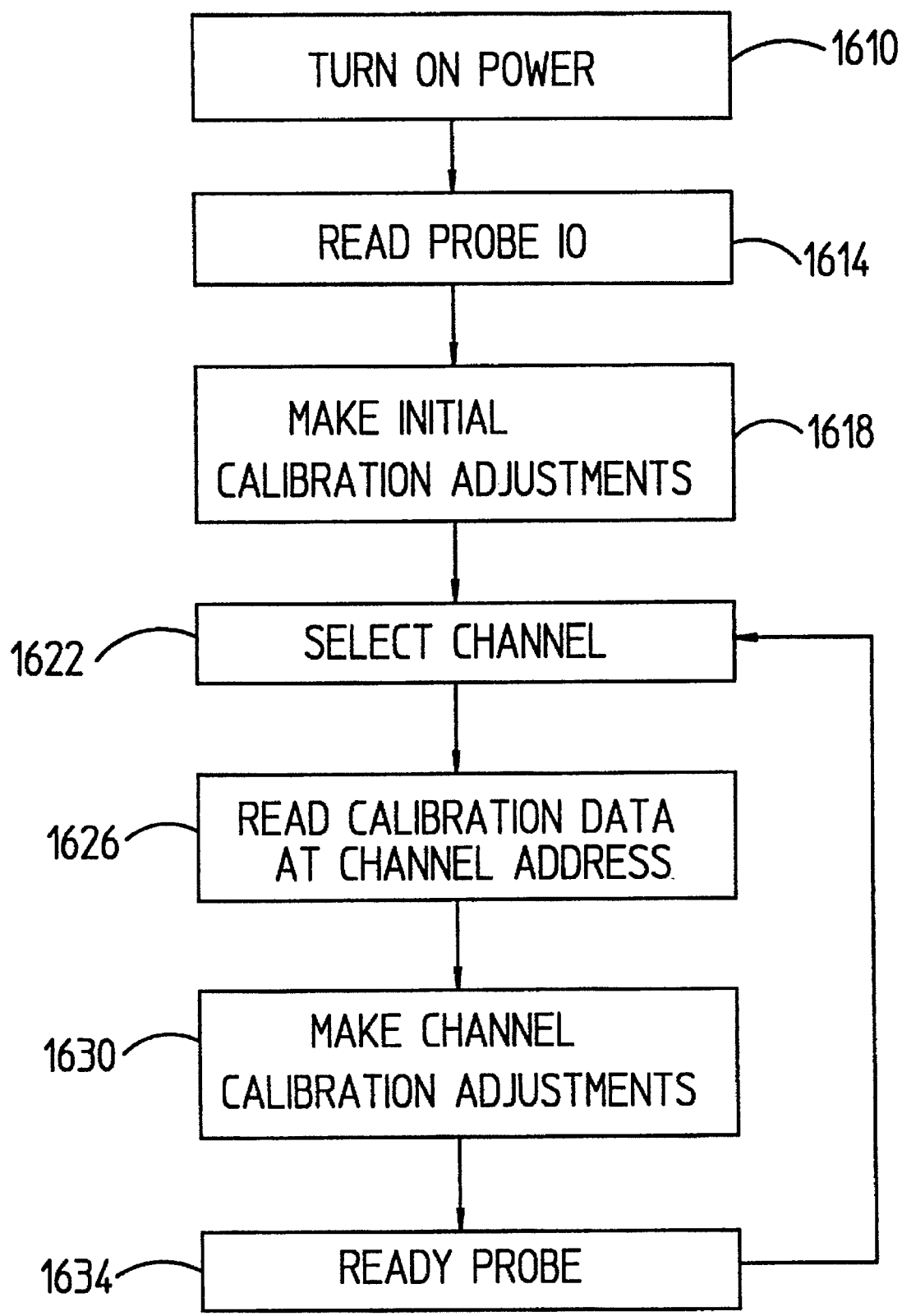
FIG. 16 is a flow chart of the process for automatic calibration of the probe system of FIG. 1.

Turning to FIG. 16, the process of using the information stored in the probe head or pad circuit memory is shown. In step 1610 the power of the main frame 133 of which the probe is a part is turned on, followed by the turn on of the probe power. The probe head, such as 103 may be connected to the PQFP 1414 as shown in FIG. 14, or one or more of the probe tips 108 may be connected to circuit nodes to be tested, either before or after turning on the power. As part of an initiation routine, the calibration control 122, using the microprocessor 125 and software in memory 126, reads the probe ID in step 1614 and then in step 1618 uses the information to adjust circuits in the mainframe as appropriate to set up the mainframe for probing circuits with the specific probe and the specific probe heads, and makes initial calibration adjustments for the probe as a whole. In step 1622 the channel or channels to be used are selected using selection means 143 (FIG. 1). Then, in step 1626, the calibration control 122, again in conjunction with microprocessor 125 and memory 126, reads the calibration information in the memory, such as 201, for the specific channel selected. In step 1630 this information is used by the calibration control 22 to apply an appropriate voltage to the offset inputs, such as 1192, to correct the probe output and to adjust circuits in the main frame 133 as required to correct the output of probe 100 for the selected channel or channels. The probe is now ready for use. Each time a new channel is selected, the probe offsets corresponding to that channel are automatically set and the main frame circuit 133 is automatically adjusted via steps 1622 through 1634 to ready the probe 100 and main frame 133 for use of the selected channel.

Another aspect of the invention that assists in producing the wide band width and high signal integrity is on-chip electrostatic discharge (ESD) protection. This feature includes on-chip spark gaps, such as 920, input circuits, such as 862, that include only electronic components that can withstand ESD events up to the breakdown voltage of the spark gaps, and on-chip diode clamping, such as via diodes 653 and 655. The combination of these techniques results in an ESD robust probe system 100 in which the paths, capacitances, and other parameters of the ESD protection are well-defined and compensated for within the circuit, thus maintaining the wide band width and high signal integrity. The excellent ESD protection also means that circuits in the field retain their high band width and high signal integrity even when exposed to ESD events.

There has been described a novel multichannel analog signal test probe which provides programmable channel selection with high signal integrity and band width, and which has many other advantages. It is evident that, now that the invention has been fully disclosed, those skilled in the art may now make numerous uses and modifications of the specific embodiment described, without departing from the inventive concepts. For example, now that it is seen that an analog signal probe can be made in which any one of hundreds of channels can be selected using a keyboard or dial and at the same time can still provide the high band width and signal integrity required for such probes, others can now utilize the teachings of how to do this to design and manufacture many different varieties of analog probes. Further, now that the use of a disable circuit to permit the simple daisy-chaining of multiple multiplexer IC's and multiple types of probe heads so as to provide a variety of different options as to numbers of pins, different types of circuits, etc. that can be included in a single probe system, others can use this feature to create other varieties of probe systems than that described herein. Or equivalent components or circuits can be substituted for the various components and circuits described. Additional features may be added. A greater or lesser number of parts may be used. Consequently, the invention is to be construed as embracing each and every novel feature and novel combination of features present in and/or possessed by the test probe described.

What is claimed is:

1. An analog electronic test probe of the type including a probe head, said probe head manually connectable to a circuit to be tested and including a plurality of probe inputs and a probe output; said test probe comprising selection means for selecting one of said probe inputs; and said probe head further comprising multiplexing means, responsive to said selection means, for electrically connecting said selected probe input to said probe output; said multiplexing means comprising an integrated circuit, and said test probe further including an on-chip spark gap.

2. A test probe as in claim I wherein said selection means includes a computer.

3. A test probe as in claim 1 wherein said multiplexing means comprises:

a plurality of amplifiers, each of said amplifiers connected to one of said inputs; and means for activating the amplifier associated with said selected input.

4. test probe as in claim 1 wherein said selection means further comprises gain selection means for selecting one of a plurality of possible gains for signals passing from said selected input to said output, and said integrated circuit comprises multiple gain means, responsive to said gain selection means, for providing said selected gain to said signals.

5. A test probe as in claim 1 wherein all of the electronic components in the input circuit of said chip can withstand ESD voltages up to the break-down voltage of said spark gap.

6. A test probe as in claim 1 and further including on-chip diode clamping.

7. A test probe as in claim 1 and further including an on-chip input divider network.

8. A test probe as in claim 1 wherein said plurality of inputs each have an input impedance of 10 Kohms or greater.

9. A test probe as in claim 1 and further including memory means in said probe head for storing calibration information related to each of said probe inputs.

10. A test probe as in claim 1 wherein said probe includes a plurality of outputs, said selecting means comprises means for selecting which of said inputs is to be connected to which of said outputs, and said multiplexing means comprises means for electrically connecting each selected input to the corresponding selected output or outputs.

11. A test probe as in claim 10 wherein each combination of one of said probe inputs with one of said probe outputs defines a probe channel, and wherein said electronic probe further includes memory means in said probe head for storing calibration information related to each of said probe channels.

12. A test probe as in claim 1 wherein said circuit to be tested is a plastic quad flat pack.

13. An analog electronic test probe comprising:

a plurality of probe inputs divided into a plurality of probe input groups;

an output;

selection means for selecting one of said plurality of probe inputs;

a plurality of multiplexers, each corresponding to one of said probe input groups;

each of said multiplexers including a plurality of multiplexer inputs, each connected to a probe input in its corresponding probe input group;

each of said multiplexers including a multiplexer output;

each multiplexer responsive to said selection means for electrically connecting said selected probe input to its output when said selected probe input is in the group of probe inputs corresponding to said mutliplexer; and said multiplexer outputs being daisy-chained together and connectable to said probe output.

14. A test probe as in claim 13 wherein each of said multiplexer integrated circuits includes outdisable means for placing its multiplexer output in a state in which it appears electrically as an open circuit when none of the inputs in its corresponding group of probe inputs is selected.

15. A test probe as in claim 13 wherein:

said probe includes a plurality of probe outputs;

said selection means comprises means for selecting which of said plurality of probe inputs is to be electrically connected to which of said probe outputs;

said multiplexing means includes a plurality of multiplexer stages, each stage having a plurality of multiplexers and an output, each of said multiplexer stage outputs corresponding to one of said probe outputs;

each of said multiplexers responsive to said selection means for electrically connecting each of said selected input or inputs in its corresponding group of probe inputs to its output or outputs when the output of its corresponding stage corresponds to the selected probe output or one of the selected probe outputs; and each set of said multiplexer outputs corresponding to one of said probe outputs daisy-chained together and electrically connectable to said corresponding probe output.

16. An analog electronic test probe comprising:

a plurality of probe inputs divided into a plurality of probe input groups;

an output;

selection means for selecting one of said plurality of probe inputs;

a plurality of integrated circuits, each corresponding to one of said probe input groups;

each of said integrated circuits including a plurality of integrated circuit inputs, each connected to a probe input in its corresponding probe input group;

each of said integrated circuits including an integrated circuit output;

each integrated circuit responsive to said selection means for electrically connecting said selected probe input to its output when said selected probe input is in the group of probe inputs corresponding to said integrated circuit; and said integrated circuit outputs being daisy-chained together and connectable to said probe output.

17. A test probe as in claim 16 wherein each of said integrated circuits includes outdisable means for placing its integrated circuit output in a state in which it appears electrically as an open circuit when none of the inputs in its corresponding group of probe inputs is selected.

* * * * *